United States Patent
Roberts et al.

(10) Patent No.: US 7,075,112 B2
(45) Date of Patent: Jul. 11, 2006

(54) HIGH POWER RADIATION EMITTER DEVICE AND HEAT DISSIPATING PACKAGE FOR ELECTRONIC COMPONENTS

(75) Inventors: John K. Roberts, East Grand Rapids, MI (US); Spencer D. Reese, Auburn, IN (US)

(73) Assignee: Gentex Corporation, Zeeland, MI (US)

(*) Notice: Subject to any disclaimer, the term of this patent is extended or adjusted under 35 U.S.C. 154(b) by 0 days.

(21) Appl. No.: 10/470,879

(22) PCT Filed: Jan. 31, 2002

(86) PCT No.: PCT/US02/03161

§ 371 (c)(1),
(2), (4) Date: Jan. 29, 2004

(87) PCT Pub. No.: WO02/061805

PCT Pub. Date: Aug. 8, 2002

(65) Prior Publication Data

US 2004/0113549 A1    Jun. 17, 2004

Related U.S. Application Data

(63) Continuation-in-part of application No. 09/835,238, filed on Apr. 13, 2001, now Pat. No. 6,639,360.

(60) Provisional application No. 60/265,487, filed on Jan. 31, 2001.

(51) Int. Cl.
*H01L 27/15* (2006.01)
*H01L 31/12* (2006.01)
*H01L 33/00* (2006.01)

(52) U.S. Cl. .................................... 257/79; 257/98

(58) Field of Classification Search .............. 257/13, 257/21, 79–82, 98–100
See application file for complete search history.

(56) References Cited

U.S. PATENT DOCUMENTS 3,920,495 A    11/1975 Roberts
4,125,777 A    11/1978 O'Brien et al.

(Continued)

FOREIGN PATENT DOCUMENTS

JP    5-205879    8/1993

(Continued)

OTHER PUBLICATIONS

Opto Technology, Inc., "High Power White illuminator-Preliminary," Spec Sheet, OTLWHTA-9-4-66-E, (Aug. 1999).

(Continued)

*Primary Examiner*—Hoai Pham
(74) *Attorney, Agent, or Firm*—Price, Heneveld, Cooper, DeWitt & Litton, LLP

(57) ABSTRACT

The electronic component package (10) of the present invention includes a sealed chamber; a liquid or gel (20) contained in the sealed chamber; at least one electronic component (12) disposed in the sealed chamber in physical and thermal contact with the liquid or gel (20); and at least one electrical conductor electrically coupled to the electronic component and extending out of the sealed chamber. The electronic component(s) (12) may include any one or combination of a radiation emitter, a thermal or optical sensor, a resistor, and a microprocessor or other semiconductor component.

27 Claims, 13 Drawing Sheets

U.S. PATENT DOCUMENTS

| | | | |
|---|---|---|---|
| 4,257,061 A | 3/1981 | Chapel, Jr. et al. | |
| 4,267,559 A | 5/1981 | Johnson et al. | |
| 4,394,600 A | 7/1983 | Flannagan | |
| 4,729,076 A | 3/1988 | Masami et al. | |
| 4,911,519 A | 3/1990 | Burton et al. | |
| 4,996,586 A | 2/1991 | Matsuda et al. | |
| 5,032,898 A | 7/1991 | Bowen et al. | |
| 5,060,027 A | 10/1991 | Hart et al. | |
| 5,113,232 A | 5/1992 | Itoh et al. | |
| 5,136,205 A | 8/1992 | Sokolich et al. | |
| 5,173,839 A | 12/1992 | Metz, Jr. | |
| 5,181,874 A | 1/1993 | Sokolich et al. | |
| 5,235,347 A | 8/1993 | Lee | |
| 5,291,039 A | 3/1994 | Ogata et al. | |
| 5,434,750 A | 7/1995 | Rostoker et al. | |
| 5,629,232 A | 5/1997 | Jiang | |
| 5,632,551 A | 5/1997 | Roney et al. | |
| 5,656,823 A | 8/1997 | Kruangam | |
| 5,680,008 A | 10/1997 | Brandes et al. | |
| 5,753,928 A | 5/1998 | Krause | |
| 5,777,433 A | 7/1998 | Lester et al. | |
| 5,785,418 A | 7/1998 | Hochstein | |
| 5,789,772 A | 8/1998 | Jiang | |
| 5,825,794 A | 10/1998 | Ogino et al. | |
| 5,841,177 A | 11/1998 | Komoto et al. | |
| 5,869,883 A | 2/1999 | Mehringer et al. | |
| 5,885,475 A | 3/1999 | Salyer | |
| 5,929,557 A | 7/1999 | Makishima et al. | |
| 5,940,683 A | 8/1999 | Holm et al. | |
| 5,945,217 A | 8/1999 | Hanrahan | |
| 5,952,680 A | 9/1999 | Strite | |
| 5,958,100 A | 9/1999 | Farnworth et al. | |
| 5,959,316 A | 9/1999 | Lowery | |
| 5,966,393 A | 10/1999 | Hide et al. | |
| 5,972,528 A | 10/1999 | Kim | |
| 5,998,047 A | 12/1999 | Bechtel et al. | |
| 6,274,924 B1 | 8/2001 | Carey et al. | |
| 6,356,376 B1 * | 3/2002 | Tonar et al. | 359/267 |

FOREIGN PATENT DOCUMENTS

| | | |
|---|---|---|
| JP | 7-283441 | 10/1995 |
| JP | 3016636 | 10/1995 |
| JP | 7-312446 | 11/1995 |
| JP | 8-154150 | 6/1996 |
| WO | WO 97/48134 | 12/1997 |

OTHER PUBLICATIONS

Hewlett-Packard, Inc., "Super Flux LEDs," Technical Data, (1998).

Opto Technology, Inc., "Very High Power IR Illuminator," Spec Sheet, OTL880B-9-4-66-E, (May 1998).

Diemat Product Data Sheet, "DM6030Hk Ag Epoxy Adhesive Paste," (May 11, 1999).

Epoxy Technology, "Products-Optical: Product Listing," www.epotek.com/optical_listing.html.

John K. Roberts (Gentex Corporation), "Binary Complementary Synthetic-White LED Illuminators," SAE Technical Paper Series 1999-01-0657, (Mar. 1-4, 1999), p. 1-17.

Hewlett-Packard, Inc., "LED Stop Lamps Help Reduce the Number and Severity of Automobile Accidents," Application Note 1155-3, (1998).

Advanced Thermoelectric Products, "The Basics," www.electracool.com/moduleworking.html, (1999).

Opto Technology, Inc., "High Power Red Illuminator," Spec Sheet OTL680A-9-4-66-E, (Jun. 1998).

Hewlett-Packard, Inc., "Differences Between the SnapLED 150 and Super Flux/SnapLED Products," Application Note 1177, (1999).

Hewlett-Packard, Inc., "High-Flux LED," Technical Data, (1999).

Hewlett-Packard, Inc., "SnapLED 70 LEDs," Preliminary Technical Data, (1999).

Cree Research, Inc., "G-SiC® Technology Super Bright LEDS CXXX-CB290-E1000," Spec Sheet, May 1999, pp. 1-4.

Opto Technology, Inc., "New Products-High Output Blue, Green, and Red LED Illuminators," www.optotech.com, (1998).

* cited by examiner

FIG. 15
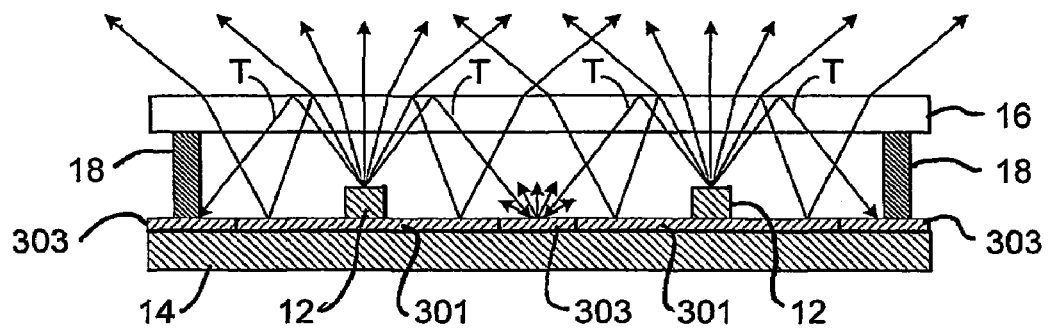
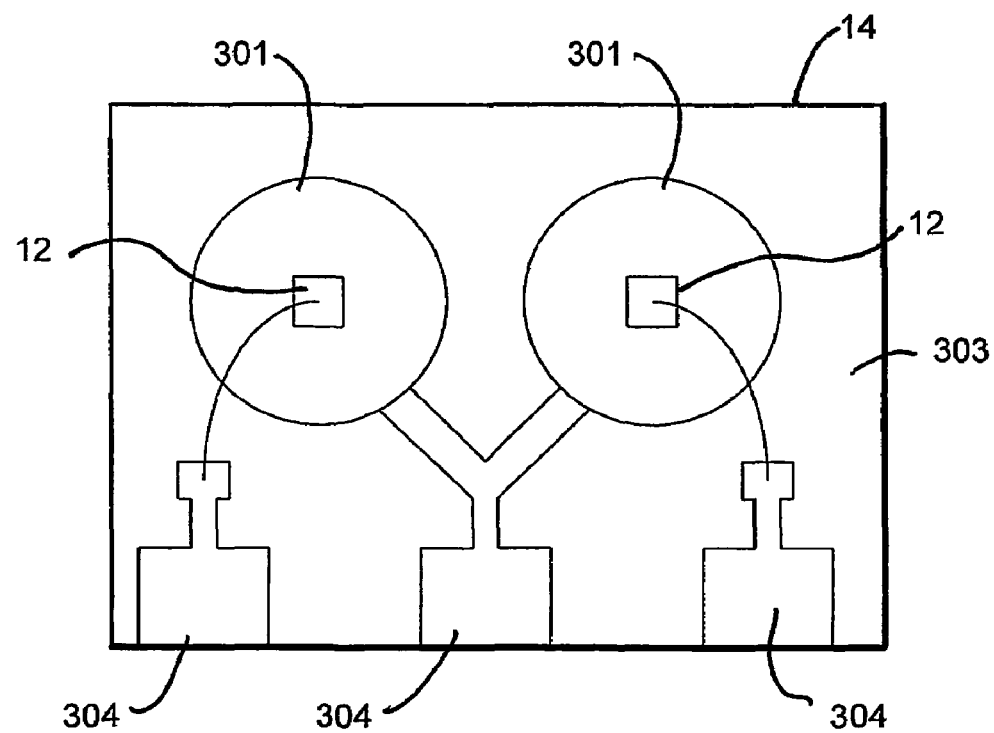
FIG. 16

HIGH POWER RADIATION EMITTER DEVICE AND HEAT DISSIPATING PACKAGE FOR ELECTRONIC COMPONENTS

CROSS-REFERENCE TO RELATED APPLICATIONS

This application is a continuation-in-part of U.S. patent application Ser. No. 09/835,238 filed on Apr. 13, 2001, now U.S. Pat. No. 6,639,360, which claims benefit of U.S. Provisional Application No. 60/265,487 filed on Jan. 31, 2001.

BACKGROUND OF THE INVENTION

The present invention generally relates to radiation emitter assemblies such as, for example, light emitting diode (LED) packages and to heat dissipating packages for electronic components.

Radiation emitters, particularly optical radiation emitters, are used in a wide variety of commercial and industrial products and systems and accordingly come in many forms and packages. As used herein, the term "optical radiation emitter" includes all emitter devices that emit visible light, near infrared (IR) radiation, and ultraviolet (UV) radiation. Such optical radiation emitters may be photoluminescent, electroluminescent, or other solid state emitter. Photoluminescent sources include phosphorescent and fluorescent sources. Fluorescent sources include phosphors and fluorescent dyes, pigments, crystals, substrates, coatings, and other materials.

Electroluminescent sources include semiconductor optical radiation emitters and other devices that emit optical radiation in response to electrical excitation. Semiconductor optical radiation emitters include light emitting diode (LED) chips, light emitting polymers (LEPs), organic light emitting devices (OLEDs), polymer light emitting devices (PLEDs), etc.

Semiconductor optical emitter components, particularly LED devices, have become commonplace in a wide variety of consumer and industrial optoelectronic applications. Other types of semiconductor optical emitter components, including OLEDs, LEPs, and the like, may also be packaged in discrete components suitable as substitutes for conventional inorganic LEDs in many of these applications.

Visible LED components of all colors are used alone or in small clusters as status indicators on such products as computer monitors, coffee makers, stereo receivers, CD players, VCRs, and the like. Such indicators are also found in a diversity of systems such as instrument panels in aircraft, trains, ships, cars, trucks, minivans and sport utility vehicles, etc. Addressable arrays containing hundreds or thousands of visible LED components are found in moving-message displays such as those found in many airports and stock market trading centers and also as high brightness large-area outdoor television screens found in many sports complexes and on some urban billboards.

Amber, red, and red-orange emitting visible LEDs are used in arrays of up to 100 components in visual signaling systems such as vehicle center high mounted stop lamps (CHMSLs), brake lamps, exterior turn signals and hazard flashers, exterior signaling mirrors, and for roadway construction hazard markers. Amber, red, and blue-green emitting visible LEDs are increasingly being used in much larger arrays of up to 300 components as stop/slow/go lights at intersections in urban and suburban intersections.

Multi-color combinations of pluralities of visible colored LEDs are being used as the source of projected white light for illumination in binary-complementary and ternary RGB illuminators. Such illuminators are useful as vehicle or aircraft maplights, for example, or as vehicle or aircraft reading or courtesy lights, cargo lights, license plate illuminators, backup lights, and exterior mirror puddle lights. Other pertinent uses include portable flashlights and other illuminator applications where rugged, compact, lightweight, high efficiency, long-life, low voltage sources of white illumination are needed. Phosphor-enhanced "white" LEDs may also be used in some of these instances as illuminators.

IR emitting LEDs are being used for remote control and communication in such devices as VCR, TV, CD, and other audio-visual remote control units. Similarly, high intensity IR-emitting LEDs are being used for communication between IRDA devices such as desktop, laptop and palmtop computers; PDAs (personal digital assistants); and computer peripherals such as printers, network adapters, pointing devices ("mice," trackballs, etc.), keyboards, and other computers. IR LED emitters and IR receivers also serve as sensors for proximity or presence in industrial control systems, for location or orientation within such opto-electronic devices such as pointing devices and optical encoders, and as read heads in such systems as barcode scanners. IR LED emitters may also be used in a night vision system for automobiles.

Blue, violet, and UV emitting LEDs and LED lasers are being used extensively for data storage and retrieval applications such as reading and writing to high-density optical storage disks.

Performance and reliability of LED components, chips, and systems are heavily influenced by the thermal performance of those components, chips, and systems, and by ambient temperature. Elevated operating temperatures simultaneously reduce the emission efficiency of LEDs and increase the probability of failure in most conditions. This elevated temperature may be the result of high system thermal resistance acting in concert with internal LED power dissipation and may also be the result of high ambient operating temperature or other influence. Regardless of the cause, LED efficiency and reliability are normal adversely affected by increases in temperature. Thus, it is advantageous to minimize temperature rise of LED components, chips, and systems attributable to internal power dissipation during operation. This can be accomplished by reducing the conductive, convective, and radiative thermal resistance between the LED chip and ambient environment, such as by optimizing the materials and construction of the packaged device containing the LED chip. These methods, as applicable to mass-solderable, auto-insertable, and other discrete LED components, are disclosed in commonly assigned U.S. Pat. No. 6,335,548, entitled "SEMICONDUCTOR RADIATION EMITTER PACKAGE," filed on Oct. 22, 1999, by John K. Roberts et al., and published PCT International Publication No. WO 00/55914.

For high power LED systems and high power density LED systems, system thermal performance is especially critical. LED illuminators and high power signal lights generating more than ten lumens (or more than one watt of power dissipation) are examples of systems which can benefit from improved thermal performance, especially if package area/volume must be minimized (increasing power density).

To limit the operational temperature of the LED, the power that is allowed to be dissipated through the LED is typically limited. To limit the dissipated power, however, the current that may be passed through the LED must be limited, which in turn limits the emitted flux of the LED since the emitted flux is typically proportional to the electrical current passed through the LED.

Other fundamental properties of LEDs place further restrictions on the useful operational temperature change ΔT. Semiconductor LEDs, including IR, visible, and UV emitters, emit light via the physical mechanism of electroluminescence. Their emission is characteristic of the band gap of the materials from which they are composed and their quantum efficiency varies inversely with their internal temperature. An increase in LED chip temperature results in a corresponding decrease in their emission efficiency. This effect is quite significant for all common types of LEDs for visible, UV, and IR emission. Commonly, a 1° C. increase (ΔT) in chip temperature typically results in up to a 1 percent reduction in useful radiation and up to a 0.1 nm shift in the peak wavelength of the emission, assuming operation at a constant power. Thus, a ΔT of 40° C. can result in up to a 40 percent reduction in emitted flux and a 4 nm shift in peak wavelength.

From the preceding discussion, it can be seen that to avoid thermal damage and achieve optimal LED emission performance, it is very important to minimize the ΔT experienced by the LED device chip and package during operation. This may be achieved by limiting power or reducing thermal resistance.

Limiting LED power, of course, is antithetical to the purpose of high power LEDs, i.e., to produce more useful radiation. Generating higher flux with an LED generally requires higher current (and therefore higher power). Most prior art devices, however, exhibit relatively high thermal resistance from their semiconductor radiation emitter to ambient and are compelled to limit power dissipation in order to avoid internal damage. Thus, the best 5 mm T-1¾ THD packages are limited to about 110 mW continuous power dissipation at 25° C. ambient temperature.

An additional problem faced by designers of conventional LED devices is that the wire bond used to join one of the LED leads to the LED chip can break or lose contact with the lead or the chip. Such failure can occur, for example, due to shear forces that are transferred to the wire bond through the encapsulant or thermal expansion/contraction of the encapsulant around the wire bond.

The other forms of radiation emitters mentioned above also experience performance degradation, damage, increased failure probability or accelerated decay if exposed to excessive operating temperatures.

Consequently, it is desirable to provide a radiation emitter device that has a higher emission output than conventional LED devices while being less susceptible to failure due to a break in the wire bond contact or other defect that may be caused by excessive operating temperatures.

Similar heat dissipation problems exist with respect to other electronic components. For example, large heat sinks are often attached to microprocessors of the type used in personal computers. Accordingly, an improved heat dissipation package for such electronic components is desirable.

SUMMARY OF THE INVENTION

It is an aspect of the present invention to provide a relatively high power and high power density radiation emitter device capable of high radiant flux and/or luminous flux emission. It is a further aspect of the present invention to provide a radiation emitter device exhibiting relatively low temperature rise due to internal power dissipation and increased reliability by virtue of relatively low thermal resistance. To achieve these and other aspects and advantages in accordance with one embodiment of the present invention, the radiation emitting device of the present invention comprises a sealed chamber; one or more liquids or gels contained in the sealed chamber; an electroluminescent emitter that emits optical radiation in response to an electrical signal, the electroluminescent emitter is disposed in the sealed chamber in physical and thermal contact with one of the liquids or gels; and first and second electrical conductors electrically coupled to the electroluminescent emitter for energizing the electroluminescent emitter. A portion of the structure defining the sealed chamber may be partially transparent to allow the radiation to enter or exit.

It is another aspect of the present invention to provide a package for electronic components having improved heat dissipation characteristics. To achieve these and other aspects and advantages, the electronic component package comprises first and second substrates sealed together and spaced apart to define a sealed chamber, one or more liquids or gels contained in the sealed chamber, and at least one electronic component disposed in the sealed chamber and thermal contact with one of the liquids or gels. According to one embodiment, the at least one electronic component includes a semi-conductor electronic component. According to another embodiment of the invention, the first substrate is a printed circuit board.

According to another embodiment, an optical radiation emitting device comprises: a sealed chamber; a fluid intermediary material contained in the sealed chamber and having a refractive index greater than 1.0; an electroluminescent emitter that emits optical radiation in response to an electrical signal, the electroluminescent emitter disposed in the sealed chamber in physical and thermal contact with the fluid intermediary material; and first and second electrical conductors electrically coupled to the electroluminescent emitter for energizing the electroluminescent emitter.

According to another embodiment, an optical radiation emitting device comprises: a semiconductor radiation emitter that emits optical radiation in response to an electrical signal; a protective barrier for protecting the semiconductor radiation emitter, the protective barrier comprises a material that substantially maintains its in-band optical properties over time; and first and second electrical conductors electrically coupled to the semiconductor radiation emitter for energizing the semiconductor radiation emitter.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 15 is a cross-sectional view of an alternative embodiment of the device shown in FIG. 1;

FIG. 16 is a plan view of a subassembly of the device shown in FIG. 15;

DETAILED DESCRIPTION OF THE PREFERRED EMBODIMENTS

Figure 1:
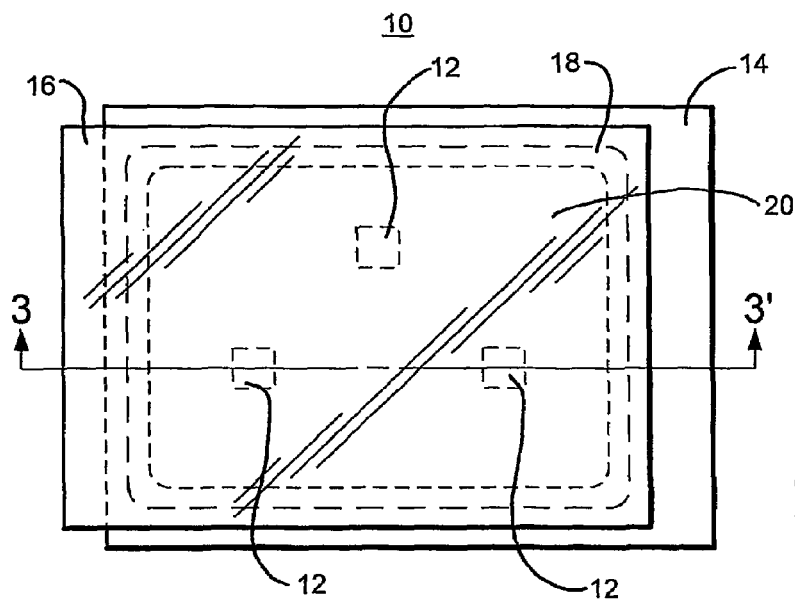
FIG. 1 is a top elevational view of a radiation emitting device constructed in accordance with a first embodiment of the present invention.

Reference will now be made in detail to the present preferred embodiments of the invention, examples of which are illustrated in the accompanying drawings. Wherever possible, the same reference numerals will be used throughout the drawings to refer to the same or like parts.

For purposes of description herein, the terms "upper," "lower," "right," "left," "rear," "front," "vertical," "horizontal," "top," "bottom," and derivatives thereof shall relate to the invention as viewed by a person looking directly at the radiation emitting source along the principal optical axis of the source. However, it is to be understood that the invention may assume various alternative orientations, except where expressly specified to the contrary. It is also to be understood that the specific device illustrated in the attached drawings and described in the following specification is simply an exemplary embodiment of the inventive concepts defined in the appended claims. Hence, specific dimensions, proportions, and other physical characteristics relating to the embodiment disclosed herein are not to be considered as limiting, unless the claims expressly state otherwise.

Several embodiments of the present invention generally relate to an improved optical radiation-emitting device useful in both high and low power applications. Such embodiments of the present invention are particularly well suited for use in limited power applications such as vehicles, portable lamps, and specialty lighting. By vehicles, we mean over-land vehicles, watercraft, aircraft and manned spacecraft, including but not limited to automobiles, trucks, vans, buses, recreational vehicles (RVs), bicycles, motorcycles and mopeds, motorized carts, electric cars, electric carts, electric bicycles, ships, boats, hovercraft, submarines, airplanes, helicopters, space stations, shuttlecraft and the like. By portable lamps, we mean camping lanterns, head or helmet-mounted lamps such as for mining, mountaineering, and spelunking, hand-held flashlights and the like. By specialty lighting we mean emergency lighting activated during power failures, fires or smoke accumulations in buildings, microscope stage illuminators, billboard front-lighting, backlighting for signs, etc. The light emitting assembly of the present invention may be used as either an illuminator or an indicator. Examples of some of the applications in which the present invention may be utilized, are disclosed in commonly assigned PCT International Publication No. WO 00/55685 entitled "INDICATORS AND ILLUMINATORS USING A SEMICONDUCTOR RADIATION EMITTER PACKAGE," by John K. Roberts et al.

Some of the embodiments of the present invention provide a highly reliable, low-voltage, long-lived, light source for vehicles, portable lighting, and specialty lighting capable of producing white light with sufficient luminous intensity to illuminate subjects of interest well enough to be seen and to have sufficient apparent color and contrast so as to be readily identifiable. Several of the radiation emitter devices of the present invention may be well suited for use with AC or DC power sources, pulse-width modulated DC power sources, and electronic control systems. The radiation emitting devices of the present invention may further be used to emit light of various colors and/or to emit non-visible radiation such as IR and UV radiation.

As used herein, the terms "radiation emitter" and "radiation emitting device" shall include any structure that generates and emits optical or non-optical radiation, while the term "optical radiation emitter" or "optical radiation emitting device" includes those radiation emitters that emit optical radiation, which includes visible light, near infrared (IR) radiation, and/or ultraviolet (UV) radiation. As noted above, optical radiation emitters may include electroluminescent sources or other solid-state sources and/or photoluminescent or other sources. One form of electroluminescent source includes semiconductor optical radiation emitters. For purposes of the present invention, "semiconductor optical radiation emitters" comprise any semiconductor component or material that emits electromagnetic radiation having a wavelength between 100 nm and 2000 nm by the physical mechanism of electroluminescence, upon passage of electrical current through the component or material. The principal function of a semiconductor optical radiation emitter within the present invention is the conversion of conducted electrical power to radiated optical power. A semiconductor optical radiation emitter may include a typical IR, visible or UV LED chip or die well known in the art and used in a wide variety of prior art devices, or it may include any alternate form of semiconductor optical radiation emitter as described below.

Alternate forms of semiconductor optical radiation emitters which may be used in the present invention are light emitting polymers (LEPs), polymer light emitting diodes (PLEDs), organic light emitting diodes (OLEDs) and the like. Such materials and optoelectronic structures made from them are electrically similar to traditional inorganic LEDs, but rely on organic compositions such as derivatives of the conductive polymer polyaniline for electroluminescence. Such semiconductor optical radiation emitters are relatively new, but may be obtained from sources such as Cambridge Display Technology, Ltd. of Cambridge, Mass. and from Uniax of Santa Barbara, Calif.

For brevity, the term semiconductor optical radiation emitter may be substituted with the term LED or the alternate forms of emitters described above or known in the art. Examples of emitters suitable for the present invention include varieties of LED chips with associated conductive pads for electrical attachment and that are emissive principally at P—N or N—P junctions within doped inorganic compounds of AlGaAs, AlInGaP, GaAs, GaP, InGaN, AlInGaN, GaN, SiC, ZnSe and the like.

LEDs are a preferred electroluminescent light source for use in the radiation emitting devices of the present invention because LEDs do not suffer appreciable reliability or field-service life degradation when mechanically or electronically switched on and off for millions of cycles. The luminous intensity and illuminance from LEDs closely approximates a linear response function with respect to applied electrical current over a broad range of conditions, making control of their intensity a relatively simple matter. Finally, recent generations of AlInGaP, AlGaAs, InGaN, AlInGaN, and GaN LEDs draw less electrical power per lumen or candela of visible light produced than incandescent lamps, resulting in more cost-effective, compact, and lightweight illuminator wiring harnesses, fuses, connectors, batteries, generators, alternators, switches, electronic controls, and optics. A number of examples have previously been mentioned and are incorporated within the scope of the present invention, although it should be recognized that the present invention has obvious other applications beyond the specific ones mentioned which do not deviate appreciably from the teachings herein and therefore are included in the scope of this invention.

Another preferred radiation source that may be used in the inventive light emitting assembly is a photoluminescent source. Photoluminescent sources produce visible light by partially absorbing visible or invisible radiation and re-emitting visible radiation. Photoluminescent sources phosphorescent and fluorescent materials, which include fluorescent dyes, pigments, crystals, substrates, coatings, as well as phosphors. Such a fluorescent or phosphorescent material may be excited by an LED or other radiation emitter and may be disposed within or on the LED, or within or on a separate optical element, such as a lens or diffuser that is not integral with an LED. Exemplary structures using a fluorescent or phosphorescent source are described further below.

As explained in more detail below, the present invention exhibits a significantly lower thermal resistance than conventional LED structures by extracting heat from the LED chip(s) via all of the surfaces of the LED chip(s) simultaneously instead of from primarily only one surface as in typical prior art LED devices. More specifically, the radiation emitter package of the present invention provides a sealed chamber or cavity containing a liquid or gel surrounding the LED chips, the liquid or gel having a moderate to high thermal conductivity, a moderate to high convectivity, or both. A material that is "moderate to highly convective" is a material that is more effectively convective than either air or a conventional clear solid polymer such as epoxy or silicone. "Effectively convective" means transporting substantial proportions of heat dissipated from a source by natural convection. The LED chips may be mounted to a moderate to high thermal conductivity plate to which a transparent plate is sealed in spaced-apart relation to define the sealed chamber or cavity. This combination is uniquely effective because heat is removed from large surfaces of the chip by conduction and by convective transport due to the natural convection of the liquid in the sealed chamber or cavity. Embodiments of the present invention are discussed below in connection with FIGS. 1–18. It will be appreciated that these embodiments are provided for purposes of illustration only and are not limiting to the present invention.

Figure 3A:
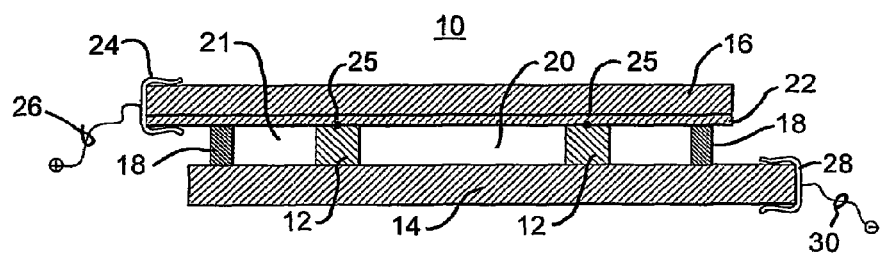
FIG. 3A is a cross-sectional view taken along line 3–3' of the radiation emitting device shown in FIG. 1.
Figure 2:
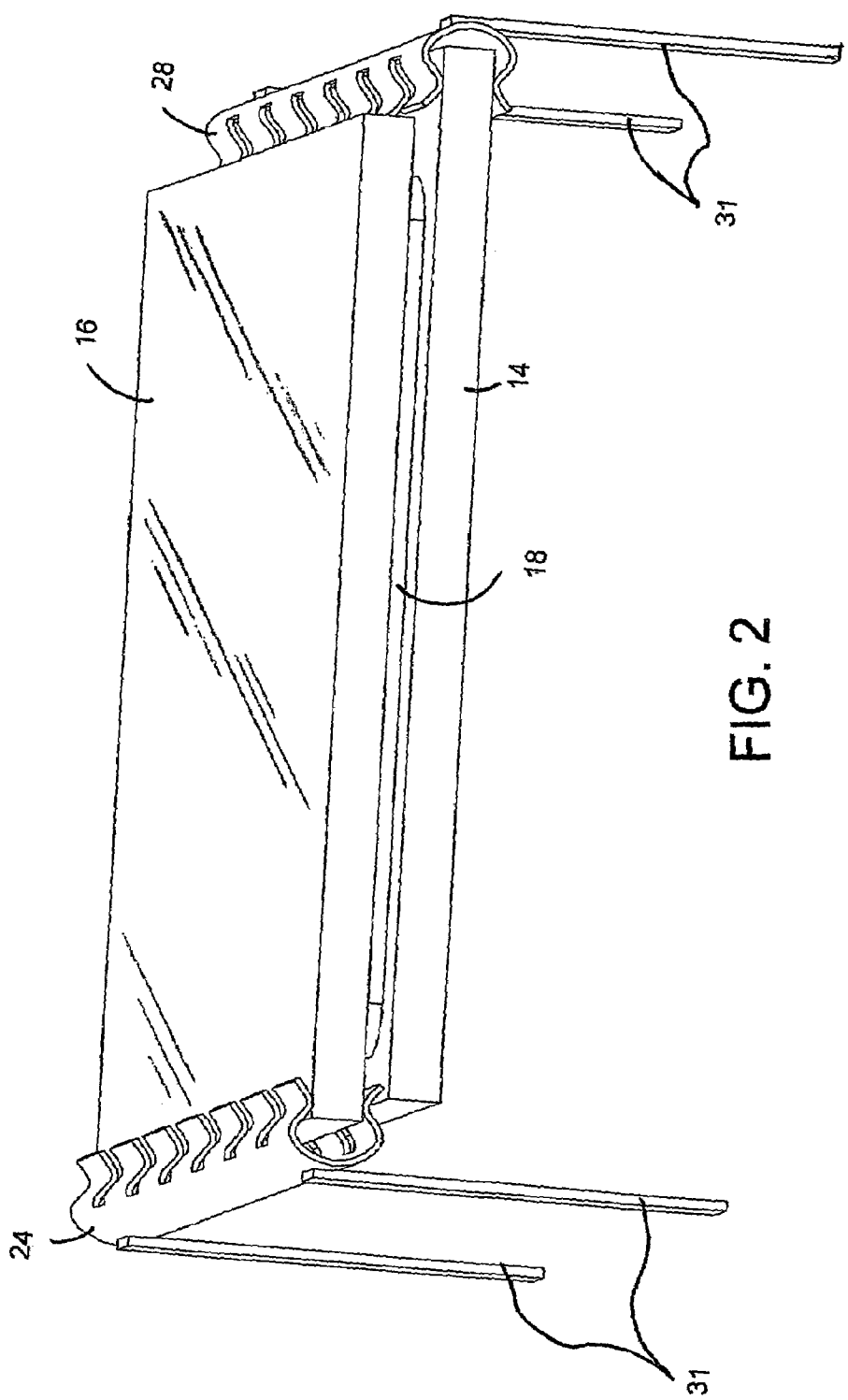
FIG. 2 is a perspective view of the radiation emitting device of first embodiment of the present invention.

FIGS. 1–3 show a radiation emitter device 10 constructed in accordance with a first embodiment of the present invention. Device 10 includes one or more radiation emitting sources 12, which are shown in FIG. 1 mounted to a first substrate 14. Although radiation emitters 12 are preferably LED chips or dies, other forms of radiation emitters may be used. The LED chips may be any conventional LED chip including those with vertical and lateral structure, transparent or absorbing substrate, electrically conductive or insulating substrate, tapered sides, Truncated Inverted Pyramid (TIP) construction, partial TIP construction, or flip chip, or other chip geometry, including LED chips utilizing AlGaAs, AlInGaP, GaAs, GaP, InGaN, AlInGaN, GaN, SiC, ZnSe and other inorganic compound semiconductor materials. The anode can be on the topmost surface of the chip, normally used for wirebond, and the cathode may be on the bottom of the chip, normally connected with die attach adhesive, solder or eutectic bonding. As with some InGaN/SiC LED chips, this polarity may be reversed such that the cathode is at the topside, normally used for wirebond and the anode is at the bottom, normally connected with die attach adhesive, solder or eutectic bonding. Alternately, both anode and cathode may be topside of the chip as in a lateral type InGaN/sapphire LED chip structure, normally connected by wirebonding. Both contacts may also be at the bottom side of the chip in flip-chip configuration, and normally attached with solder or die attach adhesive. LED chips suitable for use in the present invention included are available from sources such as Cree, AXTI, UOE, LumiLEDS and UEC and others. For purposes of this first embodiment, first substrate 14 may be made of any electrically conductive material, and preferably a material that has relatively high thermal conductivity. Preferably, first substrate 14 has a thickness of 0.5 to 6.1 mm and is made of copper or aluminum. As described below with respect to other embodiments, the first substrate may alternately be made of electrically nonconductive material (such as a ceramic, PC board, passivated metal clad board, etc.). The first substrate may also comprise all or a portion of or surface of an external cooling structure such as a heat sink or thermoelectric cooler. An optional submount made of silicon, silicon carbide, metal or other like materials, may be mounted between emitters 12 and first substrate 14 to facilitate distribution of electrical power or to moderate the physical properties of the emitters and the first substrate.

Radiation emitter assembly 10 further includes a second substrate 16 serving as a protective barrier that is spaced apart from first substrate 14. At least a portion of second substrate 16 through which radiation is emitted from radiation emitters 12 is substantially transparent to some or all of the wavelengths of radiation emitted from emitters 12. Alternatively, all of second substrate 16 may be transparent to the radiation emitted from radiation emitters 12 or alternatively transparent to all visible, IR, and/or UV radiation. For example, second substrate 16 may be made of a 0.5 to 6.1 mm glass cover plate. For some embodiments, this glass may be conventional soda-lime float glass, and in others it may be fused silica glass, borosilicate float glass or other glass composition. Second substrate 16 may also be made of tempered glass, an epoxy sheet, or transparent plastics that are aliphatic or olefinic in nature (e.g., polypropylene, polyethylene, dicylcopentadienes and polymethylpentenes). Such transparent aliphatic or olefinic plastics do not degrade when exposed to aprotic solvents such as propylene carbonate, which is one possible liquid that may be used in the present invention. These transparent plastics also function well in solid-state systems that include pure solution-phase and partial solution-phase electrolytes. These transparent plastics include: cyclic olefin copolymers such as TOPAS® available from Ticona, LLC of Summit, N.J. polymethylpentenes such as TPX™ manufactured by Mitsui; hydrogenated cyclo-olefin polymers such as ZEONEX® (based on dicyclopentadiene) manufactured by Nippon Zeon Company; and amorphous cyclo-olefin copolymers such as APEL™ manufactured by Mitsui. Another suitable polymer for the second substrate is polysulfone. Second substrate 16 should maintain its "in-band" optical properties over an extended period of time. The term "in-band" optical properties shall mean those optical properties that affect or substantially influence radiation at wavelengths emitted by the radiation emitters within the assembly. Specifically, it should maintain an absence of optical absorption (particularly, at the wavelength emitted by radiation sources within the assembly), be resistant to hazing and scattering, and be resistant to reactions that cause it to turn yellow or other color over time in such a manner as to unintentionally absorb significant portions of radiation emitted by light sources within the assembly. In many embodiments, second substrate 16 should be resistant to degradation upon prolonged, repeated or intense exposure to short-wavelength radiation such as blue, violet or UV light or upon exposure to ambient heat, heat from processing the assembly or from internal heat generated by operating the assembly. For embodiments of the present invention containing emitters of blue-green, blue, violet or UV light, it may be especially important for the second substrate 16 to start and remain substantially transparent in the short wavelength bands emitted, avoiding the yellowing phenomena typical of some transparent polymer materials, and thus avoiding excessive tendencies toward increased absorption of radiation produced by those emitters. Second substrate 16 may also be treated with a coating (not shown), such as an anti-reflection coating, a barrier coating or other thin-film coating, on one or more of its surfaces. Such a coating may be employed, for example to enhance extraction efficiency for optical radiation emitted by sources within the chamber 21 and exiting through surfaces of second substrate 16. Another coating may be used to prevent permeation of oxygen, water vapor or other agents through second substrate 16 into the chamber 21, to prevent impurities from leaching out of second substrate 16 into liquid 20, or to prevent portions of liquid 20 from permeating into or reacting with second substrate 16.

Second substrate 16 is generally semi-rigid to rigid, however it may be advantageous in some embodiments for second substrate 16 to be made substantially flexible. By making second substrate 16 flexible, it may be possible to accommodate bulk thermal expansion of liquid 20 as may occur during prolonged operation of the assembly at high power levels, or during operation in environments having an ambient temperature greater than that prevailing during the manufacture of the assembly. Such flexibility may be accomplished by utilizing thinner sheets of transparent material for construction of second substrate 16 or by choosing more flexible materials to begin with. Alternately, second substrate 16 may be made flexible by increasing the area of the chamber 21 in such a way that portions of second substrate 16 are disposed at considerable distance from retaining forces applied by seal 18 (or by other mechanisms in the vicinity of seal 18).

As shown in FIGS. 1–3, assembly 10 further includes a seal (or gasket) 18 extending between first and second substrates 14 and 16 so as to define a closed region therebetween that is hereinafter referred to as a "sealed chamber." As used herein, the term "chamber" may include a cavity or similar structure. The seal or gasket 18 is preferably made of epoxy, butyl rubber, a frit of metallic and/or glassy composition, ceramic, metal alloys such as solder, or other relatively inert barrier material. Within the sealed chamber is a liquid, gel, or other material that is either moderate to highly thermally conductive, moderate to highly convective, or both. As used herein, a "gel" is a medium having a solid structure and a liquid permeating the solid structure. Because a gel includes a liquid, the term liquid is used hereinafter to refer to liquids contained in gels as well as non-gelled liquids.

The liquid 20 is disposed within the sealed chamber 21 so as to surround each of the LED chips 12 used in the device. Enough liquid 20 may be disposed within the sealed chamber 21 such that the sealed chamber 21 is effectively filled. Alternately, the volume of liquid 20 used may be less than the volume of the sealed chamber 21 such that a portion of the sealed chamber 21 remains occupied by a bubble of air, gas or vacuum (not shown). Such an unfilled portion of the chamber 21 may be useful for accommodating thermal expansion of the liquid 20 or as a visual indication that the remainder of the chamber 21 is filled. More than one type of liquid 20 may also be used within the same sealed chamber 21 such that more than one zone is defined (not shown), and occupied by a such liquids if they are not miscible. Such a configuration may be useful if different physical, optical or chemical properties are desired for the liquid 20 present in different portions of the chamber 21. Liquid 20 is preferably, but not necessarily, electrically nonconductive. The materials utilized for substrates 14 and 16, seal 18, and LED chips 12 preferably are selected such that they do not react or otherwise ionize the liquid 20 so as to cause the liquid to become significantly electrically conductive. High electrical conductivity of liquid 20 could create a short circuit across the LED chips 12 depending upon how they are disposed in the sealed chamber 21. Preferably, liquid 20 has low to moderate thermal expansion, or a thermal expansion that substantially matches that of first substrate 14, second substrates 16, or seal 18, and in some embodiments, a slightly higher thermal expansion may be desired to increase convection while in other embodiments, a low coefficient of thermal expansion may be desired to minimize stress on the optional die attach (not shown), optional solder bumps (25) and seal 18. Liquid 20 is also preferably inert and does not readily decompose or otherwise react with external agents that manage to enter the sealed chamber 21 over time or with impurities contained within the sealed chamber 21 from the time of manufacture. Liquid 20 should also maintain its optical properties over time. Specifically, it should be resistant to reactions that cause the liquid to turn yellow or other color over time in such a manner as to unintentionally absorb significant portions of radiation emitted by light sources within the assembly. For applications where the assembly will be exposed to short wavelength radiation such as UV, violet, blue or blue-green optical radiation from the ambient environment or from emitters within the assembly, liquid 20 should be resistant to degradation upon prolonged, repeated or intense exposure such radiation. For embodiments of the present invention containing emitters of blue-green, blue, violet or UV light, it may be especially important for the liquid 20 to remain substantially colorless, avoiding excessive tendencies toward increased absorption of radiation produced by those emitters. Liquid 20 should also be compatible with the seal material. The liquid should also be substantially transparent to some or all of the wavelengths of radiation emitted from the radiation emitters 12. It will be appreciated however, that liquids may be selected or dyes may be utilized to selectively filter the radiation emitted from the radiation emitters 12. Liquid 20 also preferably has an index of refraction between that of the radiation emitters 12 and the glass or otherwise have an index that approximately matches one of the emitters or the glass. Another benefit that may result from providing liquid 20 in contact with emitters 12 and any optional wire bond, is that the liquid provides viscous damping of any vibration of the wire bond. Additionally, liquid 20 (also referred to herein as an intermediary material that is disposed between the emitter(s) and the second substrate or protective barrier) may provide increased optical extraction efficiency by minimizing internal reflection within the device. In this respect, it should be noted that most LED chip materials possess high refractive indices, such that greater light extraction losses occur by total internal reflection and internal absorption when such chips are surrounded by media with very low refractive indices. Air or other atmospheric gasses typically have a refractive index near 1.0 such that a configuration involving juxtaposition of LED chips directly against air leads to poor optical coupling. For this reason, liquid 20 is selected to have a relatively higher refractive index, consistent with other functional requirements. The refractive index of liquid 20 at the emission wavelength of sources within the assembly is generally higher than about 1.3, but is more preferably higher than 1.4 and in some cases may be higher than 1.5. With addition of small-particle fillers or other additives, liquid 20 may become a suspension or solution with an effective refractive index as high as 2.5. Such additives may include inorganic fillers or organic materials, including nanoparticles, doped nanocrystals, conventional phosphors. Certain types of optical fluids such as oils may also be available with or without such fillers or additives and having elevated refractive indices greater than 1.4 and as high as 3.0. Liquid 20 may be propylene carbonate or another liquid or gel having one or more of the above described properties. One commercially available liquid that may be used is Galden® D02TS available from Montedison S.P.A. of Milan, Italy.

The liquid 20 may be dispensed within the sealed chamber 21 by vacuum back-filling or other conventional techniques such as those used to dispense an electrochromic solution between two glass substrates when making an electrochromic mirror or window. One or more fill holes may be provided in either the seal or in one or both of the substrates. After the sealed chamber 21 is filled with liquid 20, the hole(s) may be plugged with a UV-curable or other plug material.

In the embodiment shown in FIGS. 1–3, the substrates are approximately one inch by one and one quarter inch rectangles. The size of the substrates may, however, be much bigger and be as large as an architectural window or the like, or may be smaller depending on the application. Preferably, the volume of liquid in the sealed chamber 21 defined by the seal and the two substrates is more than about 20 times greater than the volume of the radiation emitters to ensure sufficient heat transport. In some embodiments, it may be possible to reduce this volume as low as 2 times the volume of the radiation emitters. Although substrates 14 and 16 are depicted in FIGS. 1 and 2 as being rectangular, it will be appreciated that the substrates may have virtually any shape. Square, circular, hexagonal and octagonal shapes may be desirable in specific applications. Seal 18 need not be formed in the same shape as that of the substrates. Seal 18 serves to bond the two substrates together and form sides of the sealed chamber 21 in which liquid 20 is contained. Seal 18 should also serve as an environmental barrier so as to impede diffusion of water, oxygen, and other substances into the sealed chamber 21 while also impeding liquid 20 from exiting the sealed chamber 21. Seal 18 may also function as a spacer for maintaining the separation distance of substrates 14 and 16. Spacers (not shown) in the form of pillars, glass beads, etc. disposed between the substrates may be used as the sole means for maintaining the separation distance of substrates 14 and 16 or as a supplement to the spacing function served by the seal. The radiation emitters or other electrical components in the sealed chamber 21 (described further below) may also provide this spacing function.

To enable electrical current to flow to and through any electroluminescent radiation emitters 12 that may be present in the sealed chamber 21, electrical conductors are provided that are electrically coupled to emitters 12 and extend out from the sealed chamber 21. When an electrically conductive first substrate 14 is utilized, the negative or positive terminal of the emitters 12 may be directly mounted to first substrate 14 while the other of the terminal of emitters 12 may be soldered (note solder bumps 25) or otherwise electrically connected to a conductor 22 provided on the bottom inner surface of second substrate 16. Conductor 22 may be made of metal or made of indium tin oxide (ITO), which is a common transparent conductor. With such a configuration, the spacing between first substrate 14 and second substrate 16 would be approximately equal to the thickness of emitters 12, which is typically on the order of 0.012 inch, but may be as low as 0.001 inch or as high as 0.500 inch. In this embodiment, partial conductivity of liquid 20 may supplement or serve as the replacement for solder bumps 25 at the top of the emitters 12 making electrical connection to conductor(s) 22 on second substrate 16.

As shown in FIG. 2, electrical leads 26 and 30 may be coupled to electrical conductor 22 and first substrate 14 by respective conductive clips 24 and 28. Such clips may have a construction similar to those utilized in electrochromic devices. An example of suitable clips is disclosed in U.S. Pat. No. 6,064,509 entitled "CLIP FOR USE WITH TRANSPARENT CONDUCTIVE ELECTRODES IN ELECTROCHROMIC DEVICES" filed on Aug. 22, 1997, by William L. Tonar et al. Additionally, two pairs of lead posts 31 may extend from opposite ends of clips 24 and 28 so as to function as leads 26 and 30. Such lead posts would allow the package to be mounted to through-holes in a printed circuit board.

Figure 3B:
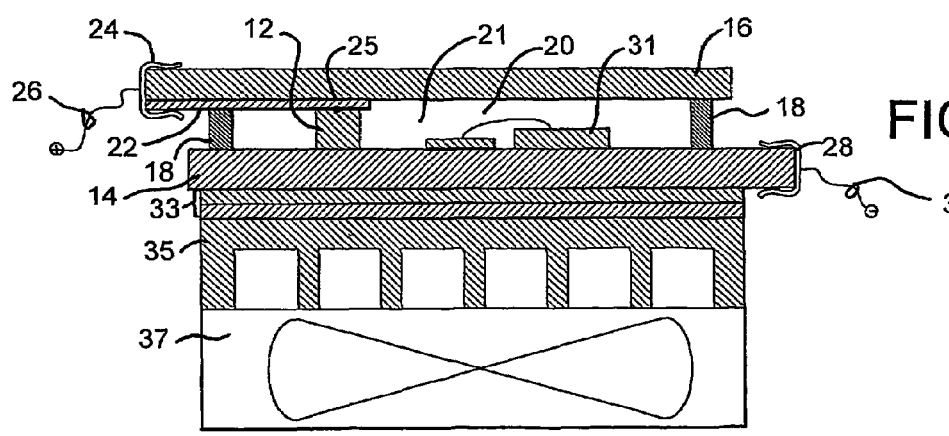
FIG. 3B is a cross-sectional view of an alternative embodiment of the device shown in FIG. 1.

While first substrate 14 is shown as a flat plate, it will be appreciated by those skilled in the art that substrate 14 may include recesses, protrusions, fins, etc. to increase the exterior surface area and maximize its effectiveness as a heat sink. For example, a heat sink such as that currently employed on Pentium or Athlon® CPU chips may be used. Additionally or alternatively, a fan, forced convection system, or Peltier type cooling system may be used to increase the dissipation of heat from the assembly. For example, a Peltier type cooling structure may be used optionally comprising a Peltier cooler 33, heat sink 35, and/or fan 37 attached to the backside of first substrate 14, as shown in FIG. 3B, or otherwise made integral with first substrate 14. Other thermoelectric cooling materials, structures or means may also be substituted for the Peltier cooling structure in this configuration. As described further below, at least one electrical component 31 may be provided in the sealed chamber 21 along with emitter(s) 12.

Furthermore, substrate 14 may include cup-shaped recesses on its upper surface with one such recess for each radiation emitter 12 provided in the device. Provided substrate 14 has a reflective upper surface, such recessed cups would serve to redirect light emitted from the sides of the emitters in a forward direction through second substrate 16. Alternatively, if substrate 14 is not otherwise reflective, the top surface may be coated with a reflective material particularly within such recessed cups or a reflective pad may be located under the emitters. Such a reflective pad may be the electrical conductor, when a nonconductive first substrate is employed.

Similarly, second substrate 16 need not have a flat upper or lower surface. Substrate 16 may include integral microlenses, diffusers, or the like. Additionally, graphic masks, appliques, or color filters may be applied to, or made integral with, one or more of the surfaces of second substrate 16. For example, an applique may be applied that allows light emitted from the emitters to be transmitted through letters of a sign, such as an exit sign. In this manner a high brightness, back-lit display panel may be provided. The panel may be static (e.g., facia, applique, screen-printed mask, etc.) or dynamic (e.g., a liquid crystal display (LCD) panel). When an LCD panel is used as second substrate 16, or otherwise attached to or mounted proximate substrate 16, it is preferred, but not essential, that the radiation emitting device include red, green, and blue (RGB) LEDs or alternatively binary complementary white emission source combination or an InGaN LED/fluorescent white emitting source combination, to enable a dynamic full-color display.

As illustrated in the drawing figures, the radiation emitting assembly may include one or more emitters 12. Radiation emitters 12 may emit light within the same wavelength bands or may emit light in different wavelength bands. For example, one or more LEDs may emit IR or UV radiation, while the others emit visible radiation. As another example, the radiation emitters may emit light of complementary colors such that the light emitted from radiation emitters 12 overlaps and forms white light or light of a color that is not otherwise emitted from any of the radiation emitters individually. To produce white light or almost any other color of illumination, three radiation emitters may be used with one emitting red light, another emitting blue light, and the third emitting green light. Alternatively, two radiation emitters may be used that emit binary complementary colors to produce effective white light in the manner disclosed in commonly assigned U.S. Pat. No. 5,803,579, entitled "ILLUMINATOR ASSEMBLY INCORPORATING LIGHT EMITTING DIODES," by Robert R. Turnbull et al.

Figure 3C:
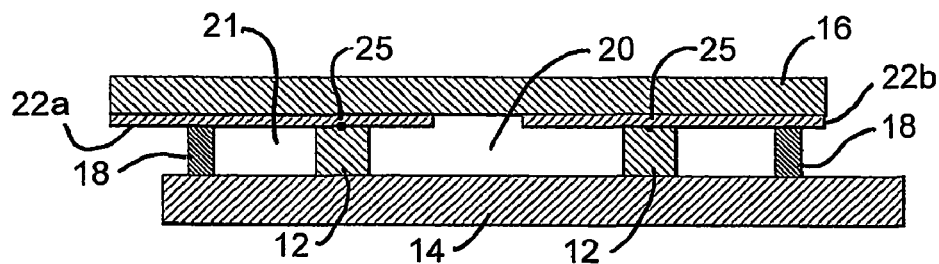
FIG. 3C is a cross-sectional view of an alternative embodiment of the device shown in FIG. 1.

When more than one radiation emitters 12 that are electroluminescent are utilized in the inventive device, separate conductive leads may be provided to each electroluminescent emitter 12 so that the emitters may be independently activated and their intensities independently controlled. For example, rather than utilizing a single transparent conductive layer 22 across the entire surface of second substrate 16 in the embodiment shown in FIGS. 1–3, the transparent conductive layer 22 may be etched or otherwise patterned so as to provide discrete connections to the top, normally positive, terminals of emitters 12. Such an example is shown in FIG. 3C where the conductive layer is patterned to form two discrete connections 22a and 22b. In this case, two separate and smaller clips (not shown) may be used in place of clip 24 (FIG. 2). Conversely, if first substrate 14 is made of an electrically nonconductive material, as in the embodiments described below and shown in FIGS. 4, 5, 6A, 6B, 10, 11, and 18 separate electrically conductive traces may be formed on the first substrate to provide discrete connections to the positive and/or negative terminals of emitters 12.

In the event it is desired to have the inventive radiation device emit white light or other colored light with a hue differing from that of light emitted by enclosed electroluminescent emitters 12, it may be desirable to incorporate a photoluminescent radiation source such as a phosphorescent or fluorescent material into substrate 16 or in a layer on substrate 16. Alternatively, a photoluminescent source may be applied as one or more blobs over an electroluminescent emitter 12, or may be dissolved or suspended in liquid 20. Photoluminescent sources could be used to enable the assembly to emit substantially white light when the photoluminescent source is irradiated by the radiation emitted from electroluminescent emitters 12. Photoluminescent sources could also be used to generate green, blue-green, amber, orange, or red light when irradiated by UV, violet, or blue emitting electroluminescent emitters 12. An example of the use of photoluminescent sources in this manner is disclosed in commonly assigned U.S. patent application Ser. No. 09/723,675, entitled "LIGHT EMIT G ASSEMBLY," and filed on Nov. 28, 2000 by John K. Roberts et al.

A photoluminescent source may additionally or alternatively be dispersed, dissolved, or suspended in liquid 20. The convection of liquid 20 may tend to keep the photoluminescent material in suspension or in solution. Such dispersal of photoluminescent media within the liquid 20 may also help maintain uniformity of color and/or luminance of the device and may help limit degradation of the photoluminescent media with long term use.

While liquid 20 has been described above as preferably being electrically nonconductive, liquid 20 may nevertheless be conductive provided that the resistance of liquid 20 is greater than that between the negative and positive terminals of the radiation emitters 12 in the chamber 21 and that the resistive path through the liquid between the electrical conductors is much greater than the resistive path through the liquid between each electrical conductors and the negative or positive terminals to which they are respectively coupled. Conceivably, by using a conductive liquid, the need for a wire bond or solder may be eliminated by allowing current to flow to an electroluminescent emitter 12 from first substrate 14 or second substrate 16 via a thin portion of liquid 20.

Additionally, additives such as anti-oxidants or UV stabilizers may be added to liquid 20 to improve system life. Electrolytes can be carefully added in small quantities to establish any optional electrical conductivity desired.

Figure 4:
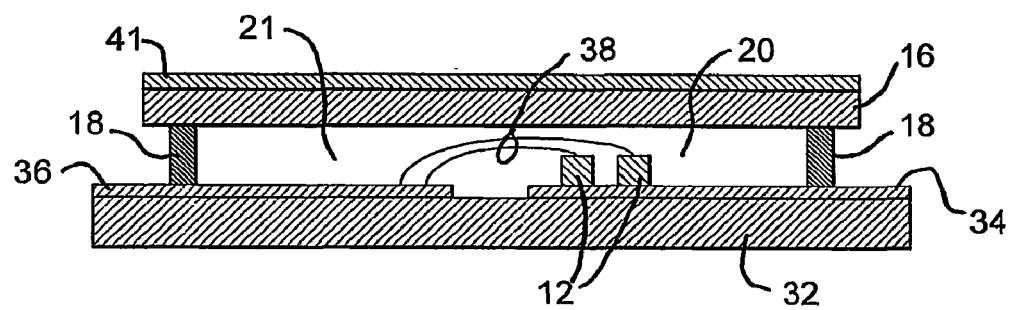
FIG. 4 is a cross-sectional view of a radiation emitter device constructed in accordance with a second embodiment of the present invention.

FIG. 4 shows a radiation emitting device 40 constructed in accordance with a second embodiment of the present invention. As shown, radiation emitting device 40 includes an electrically nonconductive first substrate 32, a second substrate 16, and a seal 18 disposed between the two substrates to define a sealed chamber 21 in which a liquid or gel 20 is contained. Device 40 further includes a first electrical trace 34 and a second electrical trace 36 provided on the upper surface of first substrate 32. As shown in FIG. 4, two radiation emitters 12 are mounted on first electrical trace 34 with their cathodes in electrical contact with trace 34. Trace 34 extends outward from the sealed chamber 21 so as to enable electrical contact with an external device. Second trace 36 also extends from within the sealed chamber and is electrically coupled to wire bonds 38 that are coupled to the negative or positive terminals of radiation emitters 12. As suggested above, both radiation emitters 12 may share common electrical traces or may have discrete traces for allowing for independent activation and control.

First substrate 32 may be made of alumina or other ceramic substrate, such as beryllia ceramic, passivated metals, metal clad or metal core printed circuit board, passivated, anodized, or laminated metal printed circuit board, or may be made of glass, an epoxy sheet, or an aliphatic or olefinic plastic such as those discussed above. If both the first and second substrates are made of plastic, it may be possible to configure and join the two substrates without requiring a seal or other spacers. Commonly-assigned U.S. Pat. No. 6,193,379, entitled "ELECTROCHROMIC ASSEMBLY INCLUDING AT LEAST ONE POLYMERIC SUBSTRATE," filed on Jun. 9, 2000, discloses various plastic materials and structures for forming sealed chambers when used for containing an electrochromic medium. Such disclosed structures may be used in the light emitting assembly of the present invention.

Device 40 may further include a micro-groove lens 41, which may be a Fresnel lens, a diffraction grating, total internal reflection (TIR) lens, catadioptric lens, kinoform lens, a holographic optical element (HOE), or other optical lens. Lens 41 may be integrally formed on either the inside or outside surface of second substrate 16 or may be optically coupled to second substrate 16. A suitable micro-groove lens is disclosed in commonly assigned U.S. Provisional Patent Application No. 60/270,054 entitled "RADIATION EMITTER DEVICE HAVING A MICRO-GROOVE LENS," filed on Feb. 19, 2001 by John K. Roberts.

Figure 5:
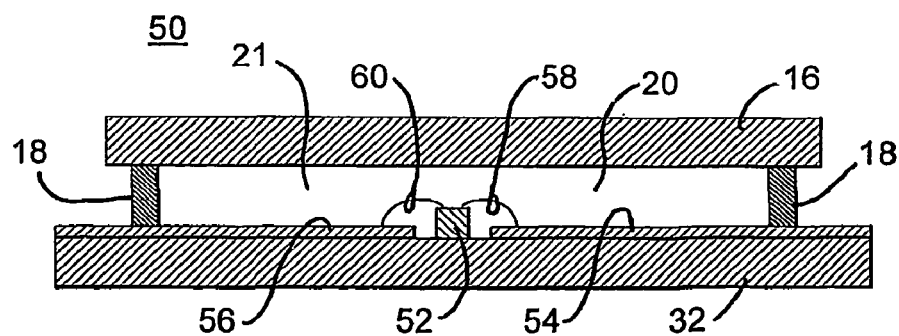
FIG. 5 is a cross-sectional view of a radiation emitter device constructed in accordance with a third embodiment of the present invention.

FIG. 5 shows a radiation emitting device 50 constructed in accordance with a third embodiment of the present invention. Like device 40 of the second embodiment, device 50 utilizes an electrically nonconductive first substrate 32 that is spaced apart from a second substrate 16 by a seal 18 that forms a sealed chamber 21 in which a liquid or gel 20 is contained. Device 50 differs from device 40 in that a lateral-type LED 52 with two top-side electrode contacts is utilized. LED 52 may be directly mounted on substrate 32 within a gap formed between a first electrical trace 54 and a second electrical trace 56 that are provided on the upper surface of substrate 32. As in the second embodiment, electrical traces 54 and 56 extend from within the sealed chamber 21 to the exterior of the device to allow for an electrical signal to be applied to LED chip 52 from the exterior of device 50. First trace 54 is provided to be coupled to a first wire bond 58 that is coupled to the anode of LED chip 52. Second trace 56 is provided for coupling to a second wire bond 60 that is coupled to the cathode of LED chip 52.

Both the embodiments shown in FIGS. 4 and 5 utilize electrical trace wires that are bonded to one of the contact terminals of the radiation emitters. Preferably, the trace wires are flat ribbon wires having a rectangular cross section and are bonded to the contact terminal of the radiation emitter using a wedge bond. Such a wire and bond reduce the spacing needed to accommodate the radiation emitters between the substrates since they provide a lower profile bond than a conventional wire having a circular cross section that is bonded using a ball-shaped bond. However, in some embodiments, conventional circular bond wire may be used, and in other embodiments, none may be necessary.

Figure 6A:
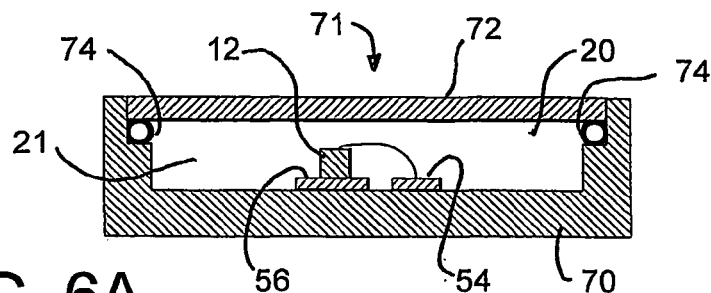
FIG. 6A is a cross-sectional view of a radiation emitter device constructed in accordance with a first variation of a fourth embodiment of the present invention.
Figure 6B:
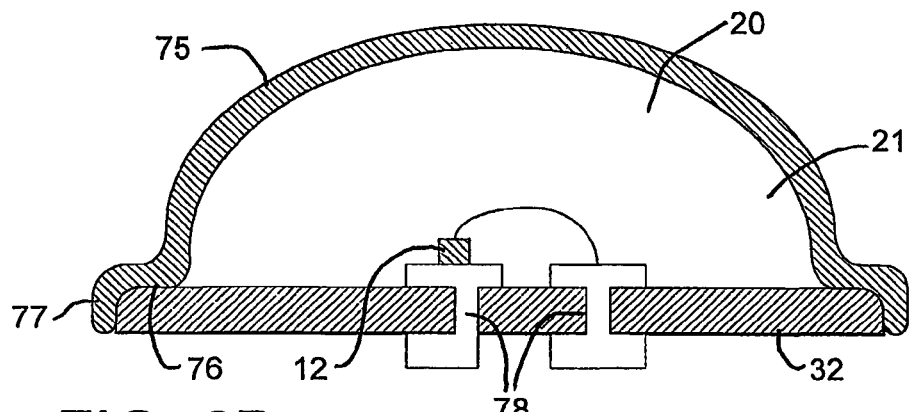
FIG. 6B is a cross-sectional view of a radiation emitter device constructed in accordance with a second variation of a fourth embodiment of the present invention.

FIGS. 6A and 6B show two variations of a fourth embodiment of the present invention whereby irregularly shaped substrates are used to form the sealed chamber 21. Specifically, in FIG. 6A, a structure is shown in which the back and at least part of the sides of the sealed chamber 21 are defined by an irregularly-shaped substrate 70, which may be transparent, partially transparent or opaque, and may be made of metal or plastic. Substrate 70 includes an opening 71 that lies above radiation emitter(s) 12. As illustrated, a window substrate 72 that is substantially transparent to the radiation emitted from radiation emitters 12, is secured to substrate 70 across opening 71. A seal or gasket 74 may be disposed between window substrate 72 and irregularly-shaped substrate 70 to seal the chamber 21.

In FIG. 6B, a structure is shown in which an irregularly shaped transparent second substrate 75 is provided to define the front and at least a portion of the sides of the sealed chamber 21. Second substrate 75 may be ultrasonically welded or otherwise bonded to first substrate 32 in order to seal the chamber 21. As illustrated, second substrate has a dome-like shape and includes a peripheral shoulder 76 and rim 77 for engaging the edges of first substrate 32. Electrical connections to radiation emitter(s) 12 may extend through vias formed in first substrate 32 that extend from an inner surface to an outer surface thereof. The chamber 21 may be filled with the second substrate inverted and prior to ultrasonic welding. Alternatively, a fill hole may be provided through first substrate so that the chamber may be filled after welding. A UV curable or other plug may then be used to seal the fill hole.

Figure 7:
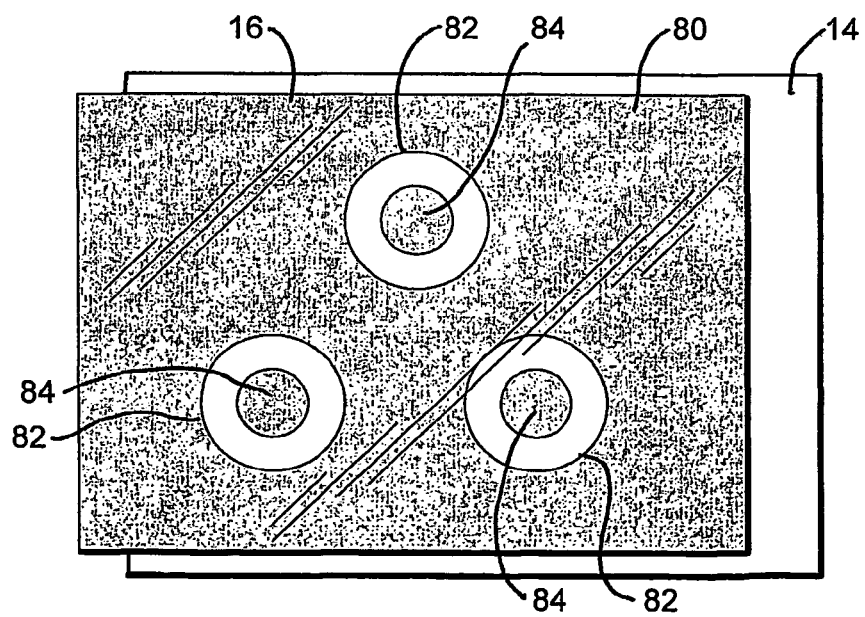
FIG. 7 is a top view of a radiation emitter device constructed in accordance with a fifth embodiment of the present invention.

FIG. 7 shows a fifth embodiment of the present invention. In this fifth embodiment, a reflective mask 80 is provided on a surface of second substrate 16. The reflective mask 80 includes a plurality of non-masked openings 82 above each radiation emitter 12. Mask 80 may optionally include a small reflective spot 84 directly over each emitter 12 so as to prevent light from directly emitting from an emitter 12 through mask 80. In this manner, emitters that emit light of different colors may be disposed within the chamber 21, and the light emitted from the emitters will mix within the chamber 21 prior to being emitted from the assembly. Mask 80 may be a patterned reflective or diffuse coating or a filter and be made integral with patterned conductors if used. Patterns other than those shown may be used to optimize various optical qualities without departing from the scope of the invention.

FIGS. 15 and 16 show yet another embodiment of the present invention. As shown in the cross-sectional view of FIG. 15, radiation emitted from emitters 12 is either nearly completely transmitted, partially transmitted and partially internally reflected, or nearly completely internally reflected from second substrate 16 depending upon the angle at which the radiation strikes the surfaces of second substrate 16. Whether radiation (i.e., a light ray) is internally reflected depends upon whether the light ray strikes the surface at an angle that is greater than the critical angle as determined by application of Fresnel's equations and Snell's Laws. If the entire upper surface of first substrate 14 served as a specular reflector, those light rays T that are totally internally reflected from a surface of second substrate 16 would continue to be totally internally reflected from the upper surface of first substrate 14 and then again from the surfaces of second substrate 16. To cause the light rays T that would otherwise be totally internally reflected, to ultimately exit through the second substrate of the radiation emitting device, upper surface of first substrate 14 may have different reflective zones—namely, a specularly reflective zone 301 and a diffuse reflective zone 303. As shown in FIGS. 15 and 16, separate specularly reflective zones 301 are provided for each emitter 12 and are circular in shape with the associated emitter 12 disposed in the center of the circle. The remainder of the upper surface of first substrate 14 (with the exception of that area covered by electrical traces and contact terminals) constitutes the diffuse reflective zone 303. Specular reflective zones 301 may be provided as a portion of the patterned electrical conductor traces 304. As will be apparent to those skilled in the art, the diameter of the circular specular reflection zone 301 is selected to be small enough not to reflect light rays that are totally internally reflected from a surface of the second substrate 16, and yet large enough to reflect all other light. The diffuse reflective zone 303 is provided to diffuse those light rays T that are totally internally reflected from a surface of the second substrate 16 and thereby reflect the light at angles that are likely to allow the light to exit the second substrate 16. Diffusely reflective zone 303 may have a coating including a photoluminescent material.

Figure 17A:
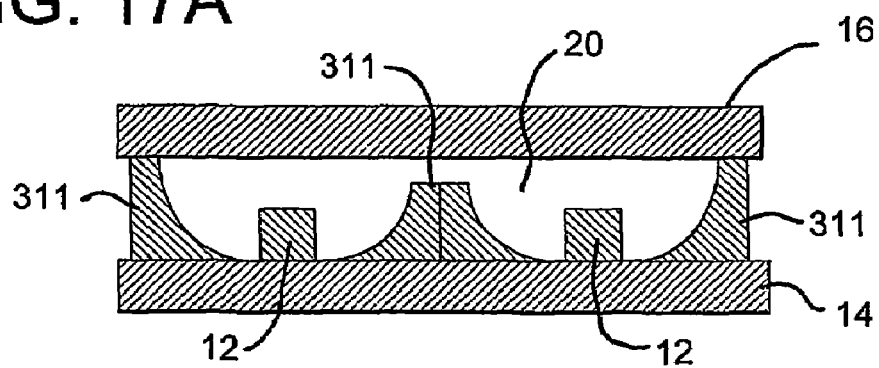
FIG. 17A is a cross-sectional view of an alternative embodiment of the device shown in FIG. 1.
Figure 17B:
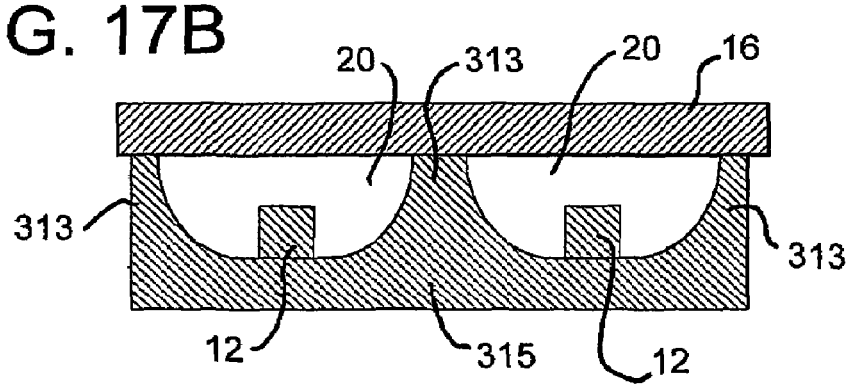
FIG. 17B is a cross-sectional view of an alternative embodiment of the device shown in FIG. 1.

While specular reflection zones 301 are shown as being circular on a planar surface, it will be appreciated that the first substrate 14 may include recessed reflective cups. FIGS. 17A and 17B show alternate variations of such a construction. Specifically, FIG. 17A shows the use of reflective partitions 311 between radiation emitters 12 so as to divert those light rays that would otherwise strike a surface of second substrate 16 at an angle exceeding the critical angle. Reflective partitions may form a parabolic reflective cup or other shaped cup and may be specular or diffuse in surface character. FIG. 17B shows a variation of the structure shown in FIG. 17A in which reflective partitions 313 are integrally formed in the upper surface of first substrate 315. Note that partitions 311 and 313 in the above embodiments may function as a spacer between the first and second substrates.

Figure 8:
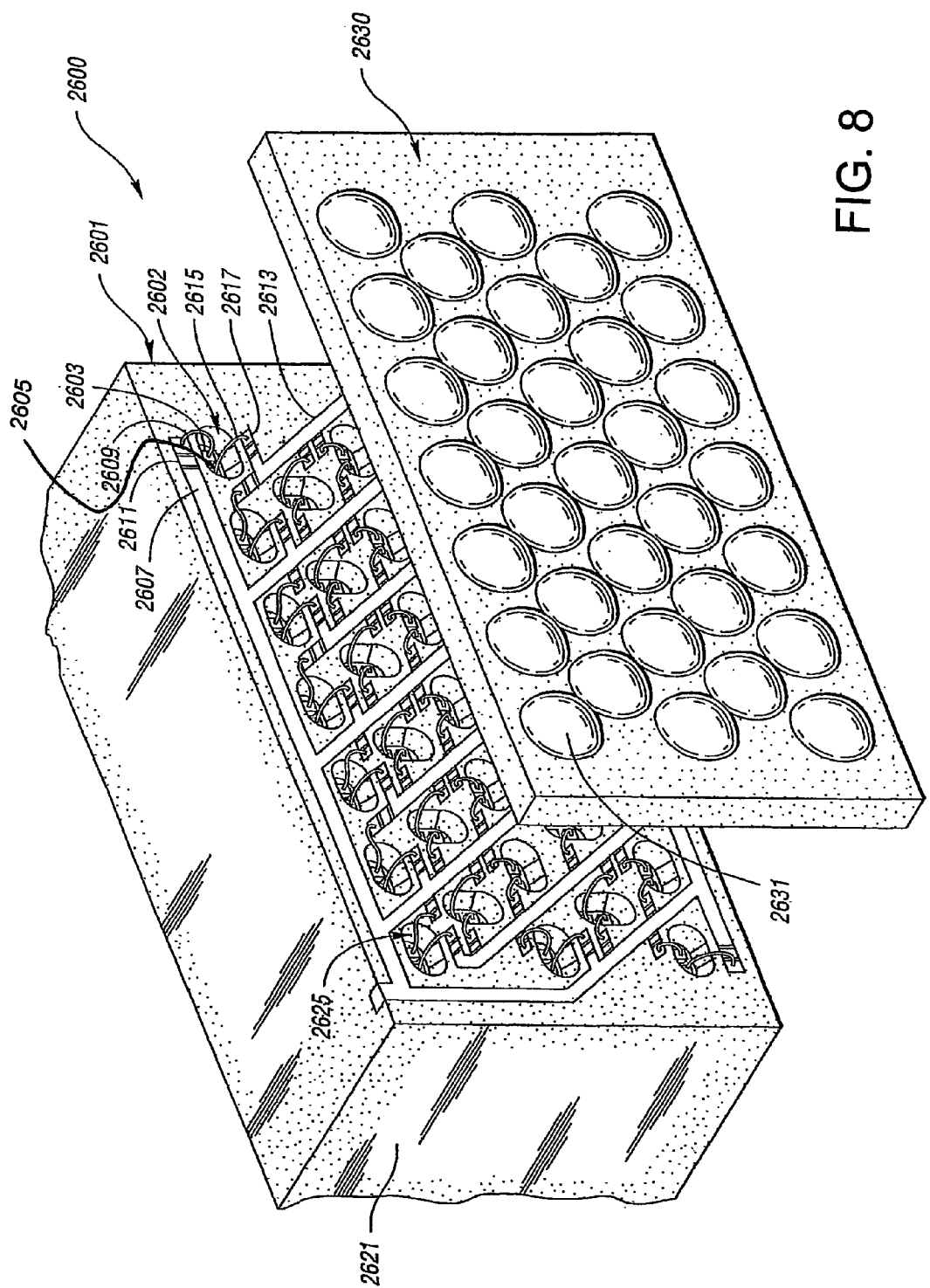
FIG. 8 is a perspective view of a vehicle headlamp assembly constructed in accordance with the present invention.

FIG. 8 shows a vehicle headlamp 2600 constructed in accordance with the present invention. As shown, the headlamp includes a light emitting assembly similar to those shown above, except that it includes an array of radiation emitters 2603 and 2605 within the sealed chamber 21 that is formed between a first substrate 2601, a second substrate 2630, and a seal (not shown). Second substrate 2630 preferably includes a plurality of micro-lenses 2631 formed in its outer surface above each one or each group of emitters 2603, 2605. First substrate 2601 preferably includes a heat extraction member 2621 and a plurality of reflective cups 2602 in which each one or each group of emitters is mounted. Emitters 2603 are connected to electrical conductor strip 2607 through a wire bond 2609 and a resistor 2611. Emitters 2605 are connected to electrical conductor strip 2613 through a bonding wire 2615 and a resistor 2617. A second assembly similar to that shown in FIG. 8 may also be disposed in a common headlamp housing and preferably disposed at an angle relative to the first assembly so as to produce high beams. By utilizing the high power light emitting assembly of the present invention, vehicle headlamps may be constructed that require fewer LEDs or other emitters to produce the requisite illumination levels that are expected for vehicles. Headlamp 2600 may also be a fog lamp or other lamp assembly.

Figure 9:
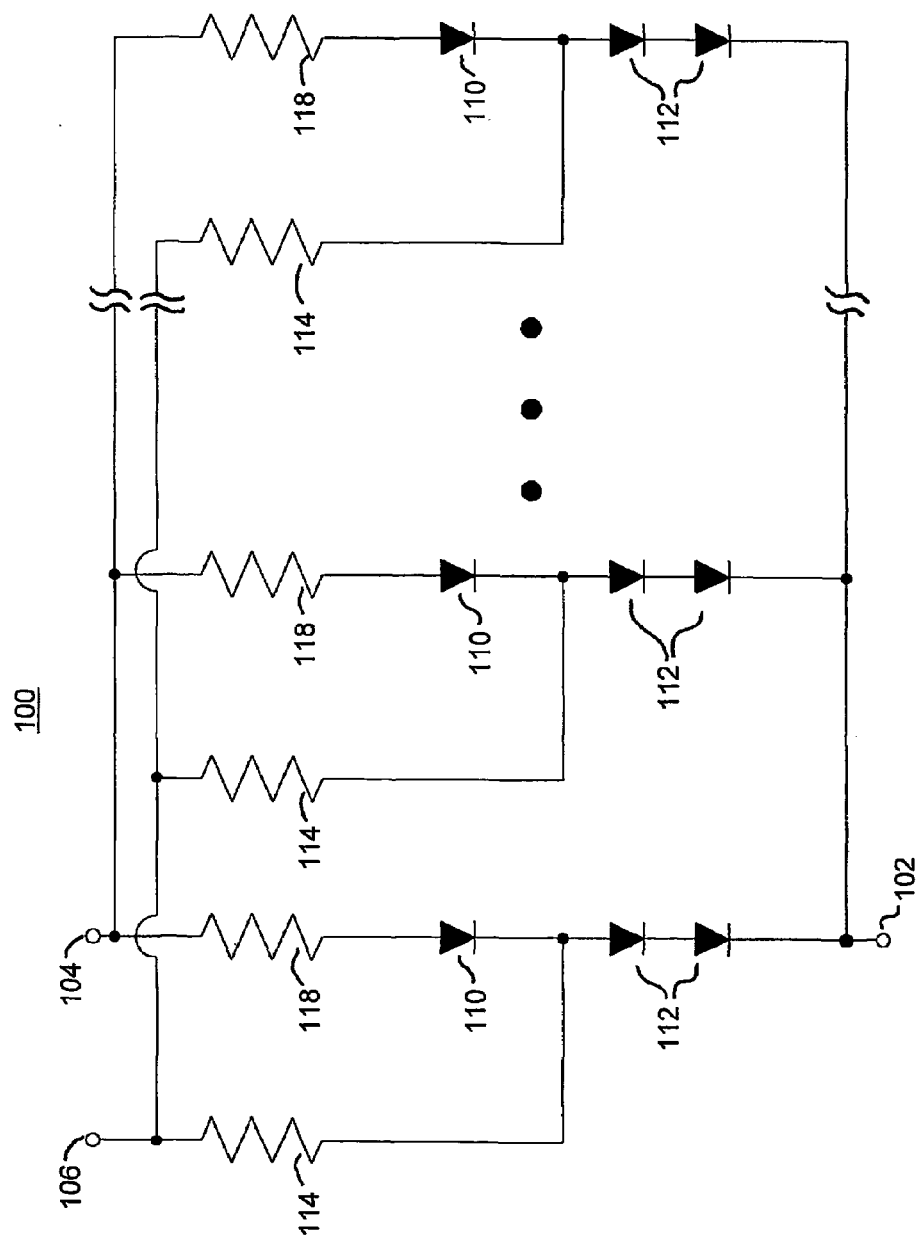
FIG. 9 is a schematic diagram of an electrical circuit that may be provided in one or more of the above embodiments.

FIG. 9 shows an exemplary circuit 100 that may be used in the above embodiments of the present invention. As shown, three external connections are provided including a ground contact 102, a first supply voltage contact 104, and a second supply voltage contact 106. The second supply voltage contact is provided to enable a bias voltage to be applied between a first LED 110, and two second LEDs 112 via a resistor 114, and thereby adjust the relative intensity of the second LEDs relative to the first LED, which is particularly advantageous when the first and second LEDs emit light of different colors. A resistor 118 is coupled between the first LED and first supply voltage contact. Resistor 118, first LED 110, and second LEDs 112 are coupled in series between first supply voltage contact 104 and ground contact 102. As shown in FIG. 9, a plurality of such series-connected LEDs may be connected in parallel. Portions of circuit 100 may be printed on one or both of substrates 14 and 16. Portions of circuit 100 may be disposed inside or outside of the sealed chamber 21, with contacts 102, 104, and 106 extending out of the chamber for external connection. Resistors 114 and 118 may likewise be provided outside of the chamber to lower the heat generated inside the chamber.

In a preferred embodiment, LEDs 110 emit blue-green light while LEDs 112 emit amber light. With such an arrangement, effective white light may be emitted from the assembly.

Figure 10:
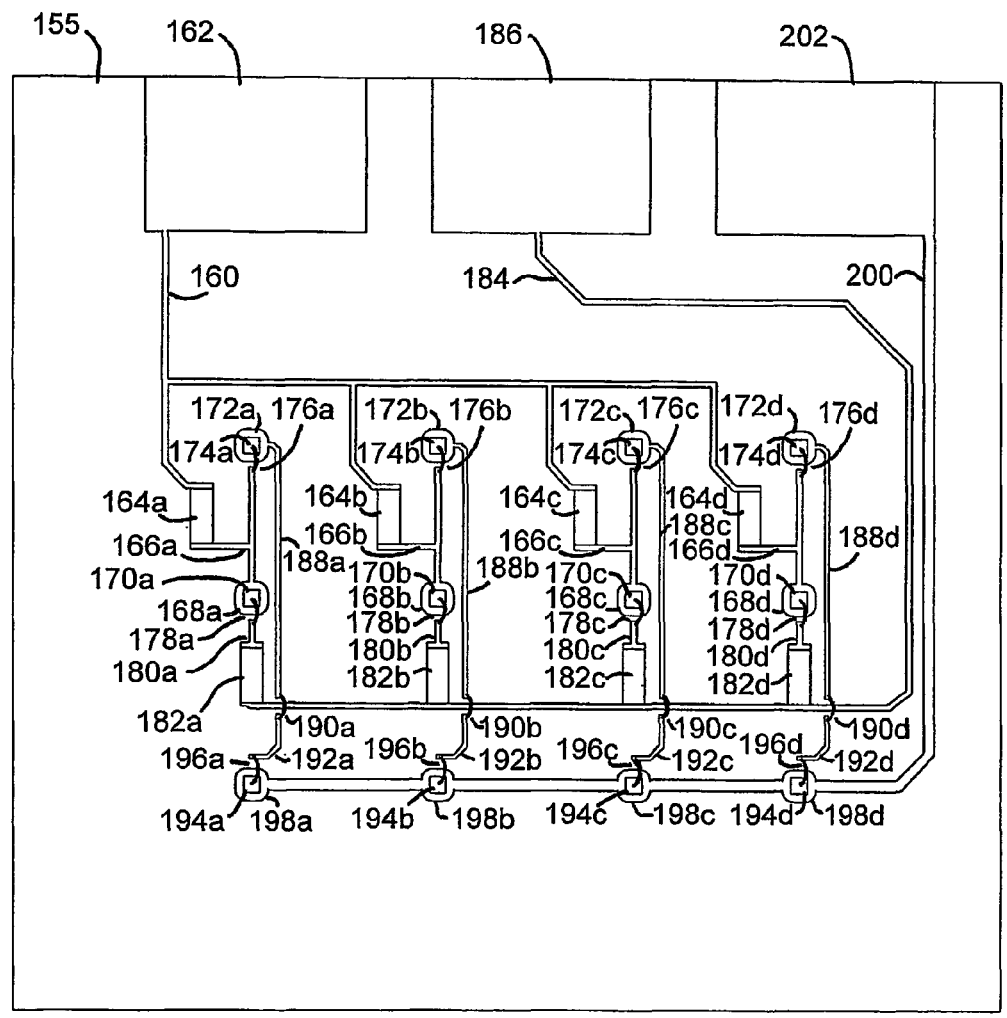
FIG. 10 is a top view of an initial package subassembly in accordance with a sixth embodiment of the present invention.
Figure 11:
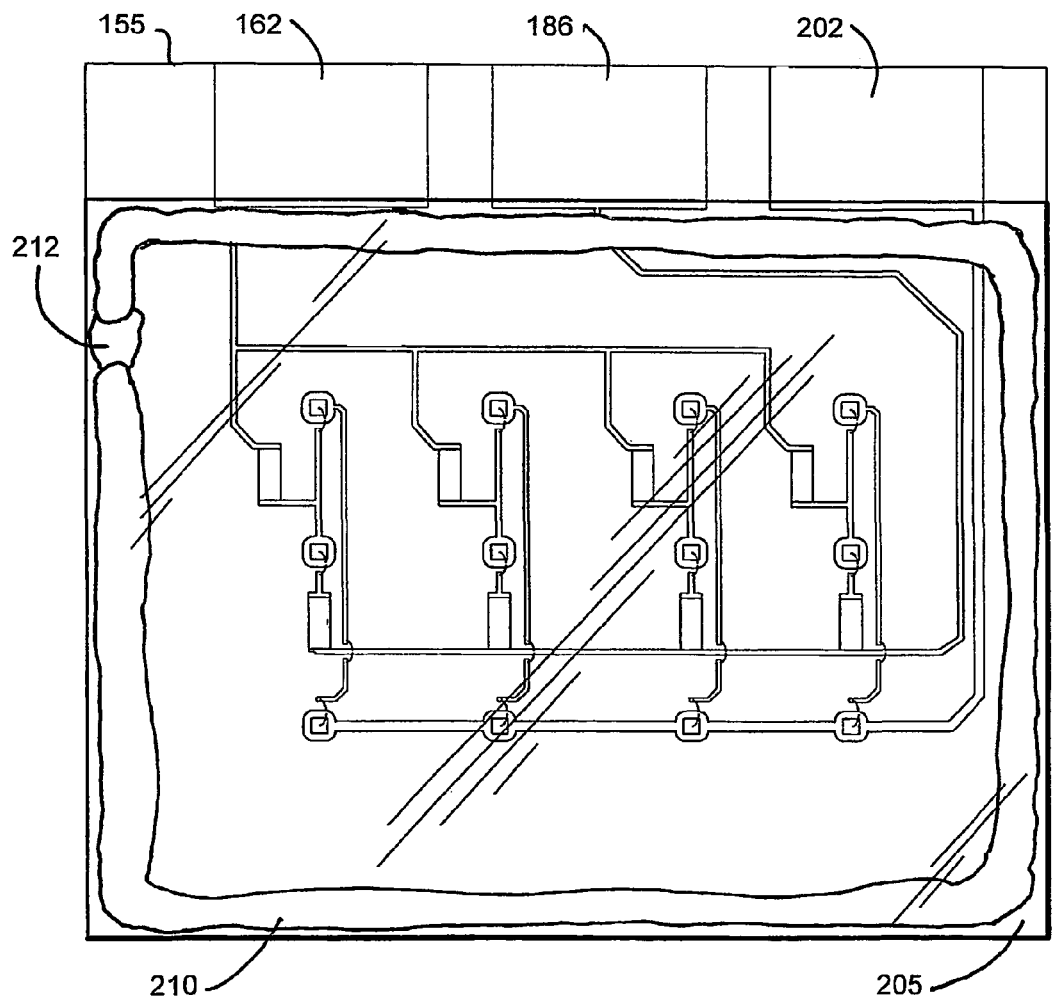
FIG. 11 is a top view of a finished package assembly constructed in accordance with the sixth embodiment of the present invention.

FIG. 10 shows an initial subassembly that forms a part of the final assembly shown in FIG. 11 in accordance with a sixth embodiment of the present invention. The package 150 includes a printed circuit board 155, which in the example provided below, is made of BeO. Various electrically conductive traces are formed on circuit board 155.

In the example shown in FIGS. 10 and 11, a first trace 160 extends from a first electrical contact 162 to a first terminal of each of four first resistors 164a–164d. Traces 166a–166b extend from a second terminal of respective resistors 164a–164d to a respective anode of a corresponding pad 168a–168d upon which is mounted a first set of LEDs 170a–170d. First LEDs 170a–170d are mounted with their anode in electrical contact with pads 168a–168d, respectively. Traces 166a–166d also extend to a position proximate pads 172a–172d upon which are mounted respective second LEDs 174a–174d. Second LEDs are mounted with their anodes in electrical contact with pads 172a–172d. Wire bonds 176a–176d electrically couple the cathodes of second LEDs 174a–174d to the end of trace 166.

The cathodes of first LEDs 170a–170d are electrically coupled via corresponding wire bonds 178a–178d to a respective trace 180a–180d, which in turn are coupled to respective first terminals of second resistors 182a–182d. Second terminals of resistors 182a–182d, in turn, are commonly coupled to a trace 184, which extends and is electrically coupled to a second contact terminal 186. The resistors 164a–164d and 182a–182d are preferably 2Ω, 1 W thick film resistors that are printed on circuit board 155.

Pads 172a–172d, to which the anodes of second LEDs 174a–174d are respectively coupled, are electrically coupled to respective traces 188a–188d. Each of these traces 188a–188d is connected by means of a respective wire bond 190a–190d to another respective trace 192a–192d on the opposite side of trace 184. Traces 192a–192d are respectively coupled to cathodes of respective third LEDs 194a–194d by a wire bond 196a–196d. The anodes of third LEDs 194a–194d are mounted on corresponding pads 198a–198d, which in turn are commonly coupled together via a trace 200 that extends and is electrically coupled to a third contact terminal 202.

With the circuit layout as shown in FIG. 10, the resulting circuit has a schematic corresponding generally to FIG. 9, where first LEDs 170a–170d correspond to LEDs 110, second and third LEDs 174a–174d and 194a–194d correspond to LEDs 112, first resistors 164a–164d correspond to resistors 114, and second resistors 182a–182d correspond to resistors 118.

In a preferred embodiment and in the example discussed below, first LEDs 170a–170d are preferably InGaN LED chips that emit blue-green light. Both the second and third LEDs 174a–174d and 194a–194d are AlInGaP LED chips that emit amber light. By utilizing these LED chips, effective white light may be emitted from the package in accordance with the teachings of U.S. Pat. No. 5,803,579 entitled "ILLUMINATOR ASSEMBLY INCORPORATING LIGHT EMITTING DIODES" by Robert R. Turnbull et al.

Once the above-described circuit has been constructed, a cover glass 205 is attached to circuit board 155 with an epoxy seal 210, which encircles the circuit components, with the exception of electrical contacts 162, 186, and 202 and with the exception of a small hole through which the resultant sealed chamber 21 may be filled with a liquid or gel. In the example discussed below, the seal chamber was filled with Galden® D02TS. Subsequently, the hole provided in the epoxy between cover 205 and circuit board 155 was plugged with a plug 212 made of Dynax UV cure adhesive. The resultant structure is shown in FIG. 11.

As apparent from FIG. 11, the resultant final package assembly includes three contact pads 162, 186, and 202, which extend outward from the sealed chamber 21 and up to the edge of printed circuit board 155. In this manner, a conventional low insertion force edge connector may be connected to the contact pads for coupling to the drive circuit. Such an edge connector may be a conventional PCI or ISA slot connector. It should be understood that another number of contact pads may be used, dependent on the electrical configuration used.

The invention will be further clarified by the following example, which is intended to be exemplary of the invention and are not intended in any manner to limit the invention.

EXAMPLE

Figure 12:
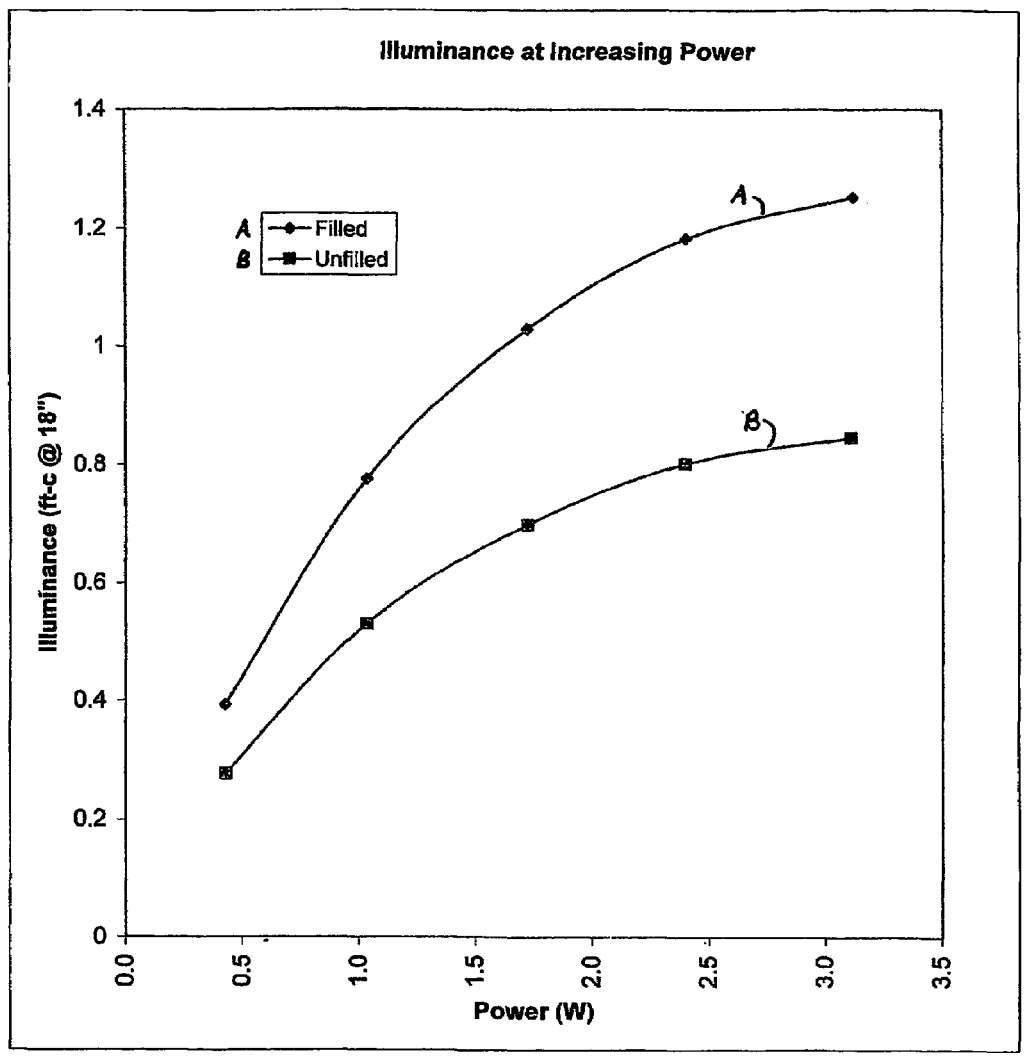
FIG. 12 is a graph illustrating the illuminance as a function of power for the package assembly shown in FIG. 11 with the chamber filled with liquid and with the sealed chamber not filled with any liquid.

To demonstrate the effectiveness of the present invention, a package assembly was constructed as illustrated in FIGS. 10 and 11 and described above. The structure had a length of approximately 1.5 inches and a width of approximately 1.5 inches, with the external contact pads being approximately 0.25 inch long. To demonstrate the effectiveness of the present invention, the illumination from the device was measured at various power levels prior to filling the sealed chamber 21 with any liquid. Then, the assembly was filled with liquid and plugged and the illuminance was again measured at the same power levels. The results of these measurements are illustrated in FIG. 12, with the illuminance measured in foot-candles at 18 inches. As apparent from FIG. 12, the provision of the liquid in physical and thermal contact with the LEDs improved their performance markedly. The improvement increased as the applied power increased. It should be understood that, for this sample, increased illuminance at each indicated power level for the filled radiation emitter relative to the unfilled radiation emitter is an indication of reduced junction operating temperature and reduced assembly thermal resistance.

Figure 13:
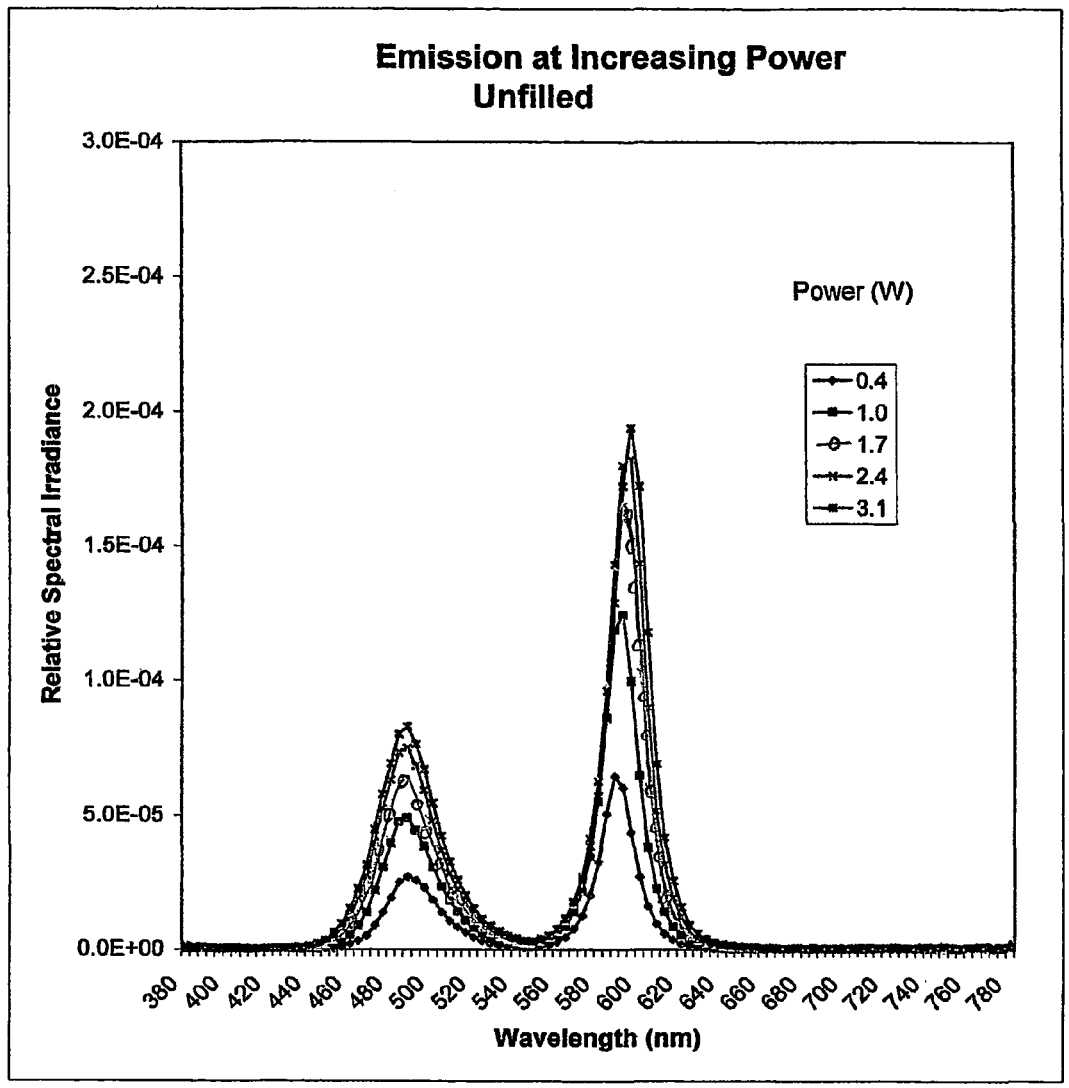
FIG. 13 is a graph of the relative spectral irradiance as a function of wavelength obtained for the package assembly shown in FIG. 11 with the chamber not filled with any liquid for various power levels.
Figure 14:
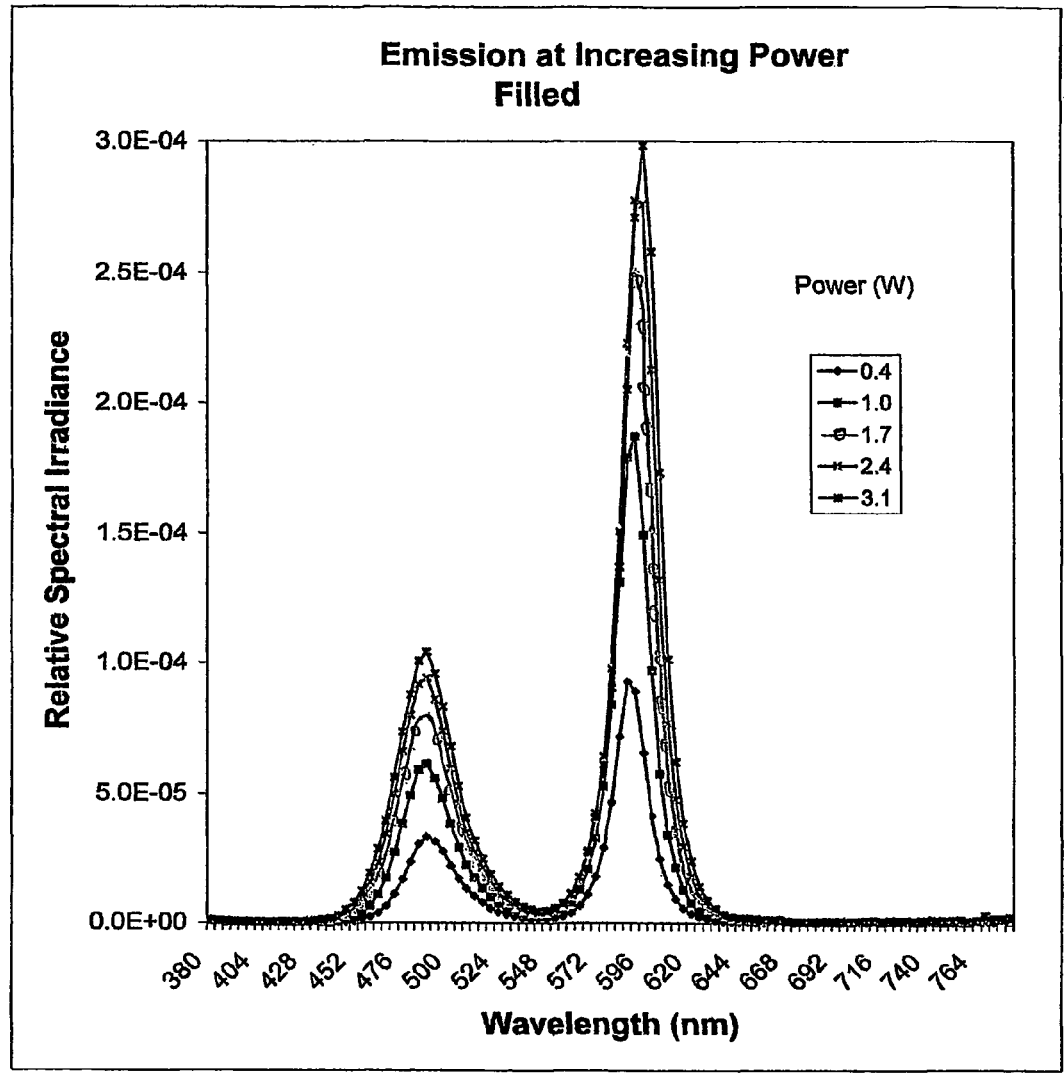
FIG. 14 is a graph of the relative spectral irradiance as a function of wavelength obtained for the package assembly shown in FIG. 11 with the chamber filled with liquid for various power levels.

FIG. 13 is a plot of the relative spectral irradiance as a function of wavelength with the chamber 21 of the device not filled with any liquid. The relative spectral irradiance was measured at five different power levels. Subsequently, after the device was filled with liquid, the same plots were obtained and are illustrated in FIG. 14.

Figure 18:
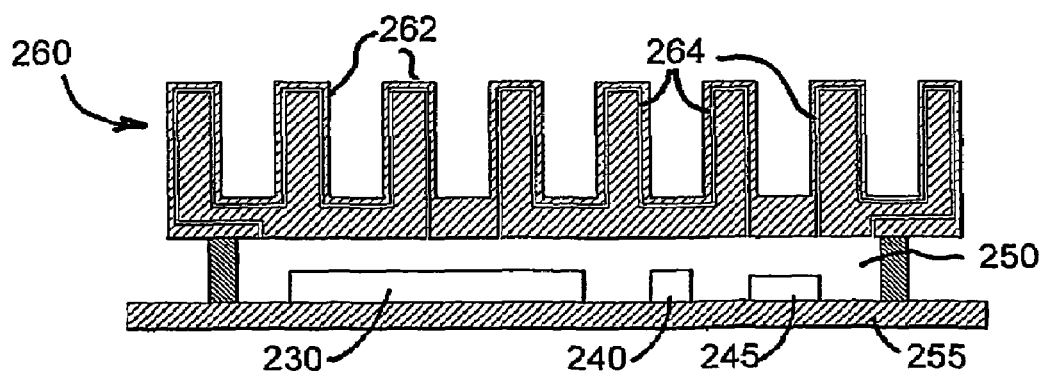
FIG. 18 is a cross-sectional view of an electronic component package assembly constructed in accordance with an alternate embodiment of the present invention.

While the above invention has been described with respect to the provision of optical radiation emitters and other radiation emitting devices within a sealed chamber 21 of the inventive package, the inventive package may similarly be used to improve the heat dissipation from other electronic components. For example, as shown in FIG. 18, a microprocessor 230, a sensor 240, a resistor 245, and other electronic components, particularly other semiconductor electronic components, may be disposed within sealed chamber 250 that is formed between two members 255 and 260. Examples of other electronic components that could desirably be placed in the sealed chamber either alone or in combination with radiation emitters, microprocessors, resistors, sensors or other components, including thermistors, diodes, Zener diodes, photodiodes, transistors, voltage regulators, Peltier effect diodes or other thermoelectric cooling chips or materials, phototransistors, etc. Members 255 and 260 may have any of the constructions discussed above. However, if none of the components within the sealed chamber are optical components, both members 255 and 260 may be opaque. Without such a constraint, first member 255 may, for example, be a printed circuit board while second member 260 may be a heat sink, preferably made of a highly thermally conductive material and having a large surface area. Such a large surface area may be provided by including various fins 262 extending outward away from the sealed chamber. As also shown in FIG. 18, various passageways 264 may be provided through heat sink member 260 through which liquid may flow. These passages may join into sealed chamber 250 to allow the liquid contained therein to flow through the passageways to expedite heat dissipation from the liquid.

The electronic components mounted in the chamber may be surface mount (SMT), through-hole (THD), ball grid array (BGA), chip-on-board, chip-on-glass, or other common semiconductor device form. Electrical connections to/from/between these components, and any patterned conductors within the chamber or to contacts exiting the chamber, may be solder, solder bump, solder paste, conductive epoxy, eutectic attach, wire bond, leadframe, or other electrical connection means.

Another alternative embodiment would enable both members 255 and 260 to be printed circuit boards that are sandwiched together by an epoxy seal and filled with a liquid or gel. This may enable heat dissipation in accordance with the present invention from circuit components mounted to either or both of the circuit boards.

It should also be appreciated that the components shown in FIG. 18 may be combined with a radiation emitter as in the other embodiments within a single sealed chamber. It may, for example, be beneficial to include resistors and/or a sensor within the same sealed chamber as the radiation emitters. Such a sensor may be a thermal sensor, such as a thermistor, so as to provide a mechanism for monitoring the temperature of the liquid within the sealed chamber and for enabling the current provided to the LED chips to be controlled as a function of the temperature within the chamber. This would allow the LED chips to be driven at their maximum safe level. It may also be desirable to include a voltage regulator to regulate the electrical drive signal to any electroluminescent radiation sources in the chamber. Additionally, it may be desirable to include any one or combination of transistors, phototransistors, diodes, photodiodes, or Zener diodes in the sealed chamber.

It may further be desirable to dispose an optical sensor within the same sealed chamber as the radiation emitters. Commonly assigned U.S. Provisional Application No. 60/192,484, entitled "LAMP ASSEMBLY INCORPORATING OPTICAL FEEDBACK," and filed on Mar. 27, 2000, by Joseph S. Stam et al. and U.S. patent application Ser. No. 09/818,958 entitled "LAMP ASSEMBLY INCORPORATING OPTICAL FEEDBACK," filed on Mar. 27, 2001 by Joseph S. Stam et al. disclose the advantages of utilizing an optical sensor in combination with a plurality of LED chips. Such sensors may be employed for many purposes such as to provide feedback for the control of electroluminescent emitters 12 in the device. In the event an optical sensor is provided in the sealed chamber, it may be desirable to incorporate light absorbing materials within the sealed chamber so as to effectively filter the light that reaches the sensor.

The radiation emitter device described herein can be used to provide a near IR night vision system for use in automobiles and other applications. A radiation emitter device is constructed as described above using IR LED die emitting radiation at a wavelength longer than the human eye can detect but still within the sensing capability of an electronic image sensor. Preferably, this wavelength range is between 800 and 880 nm, but may be as low as 700 nm or as high as 1200 nm. Such IR-emitting LED die are available from Tyntec Corporation of Hsinchu, Taiwan.

Current vehicular night vision systems have several disadvantages which are overcome by using a near IR night vision system. Current systems sense far IR radiation— essentially heat. Detectors which sense far IR radiation are significantly more expensive than detectors which sense near IR radiation. Additionally, glass is opaque to far IR radiation thus mandating that the sensor be placed outside of the vehicle's cabin thereby subjecting the system to much harsher environmental conditions. Also, glass optics cannot be used and more expensive optical materials transparent to far IR radiation must be used instead. Finally, objects which are not at a higher temperature than the ambient surroundings are not sensed as well as hot objects. Therefore, it is possible to have an object in the road which is not adequately detected by a far IR system.

The radiation emitter device of the current invention may thus be configured to emit radiation illuminating the scene imaged by the camera. In an automobile, the IR illuminator assemblies may be packaged with or near the vehicle's headlamps. Since IR radiation is not detectable to the human eye, it is possible to substantially illuminate the scene in front of a vehicle without any concern for glare disrupting oncoming or preceding drivers.

The camera is configured to image at least the same spectra of light as the IR LEDs emit. Preferably, the camera's spectral sensitivity is limited by the use of filters to only the wavelength range of light emitted by the IR LEDs. This reduces any washing-out or blooming in the image from other light sources. The camera can be mounted to look through the vehicle's windshield in the region cleaned by the vehicle's wiper and washer system by placing the camera in the mount of a rearview mirror. The camera preferably uses a wide dynamic image sensor to allow for imaging of both bright and faint objects in the forward scene simultaneously. Such an image sensor is described in commonly-assigned U.S. Pat. No. 6,008,486 entitled "WIDE DYNAMIC RANGE OPTICAL SENSOR."

If a scene rearward of the vehicle is to be imaged using such a near IR imaging system, the camera may be mounted in the center high-mounted stop lamp (CHMSL) in a tail light, or behind the rear window, while the radiation emitting device of the present invention may be mounted in the same location as the camera or in a different one of the above locations. A similar rear vision system is disclosed in commonly assigned PCT International Publication No. WO 00/15462, entitled "SYSTEMS AND COMPONENTS FOR ENHANCING REAR VISION FROM A VEHICLE," by Frederick T. Bauer et al.

As will be appreciated by those skilled in the art, the radiation emitting device of the present invention allows for more efficient extraction of the heat generated by the radiation emitters. This improved extraction allows for a greater driving current to be delivered to the radiation emitters, which, in turn, generates higher radiation flux levels than previously obtained. The LED construction disclosed in the commonly-assigned U.S. Pat. No. 6,335,548 discussed above, achieves power densities of up to about 2 $W/in^2$ or more while the structure of the present invention may obtain power densities of up to 5 to 10 $W/in^2$ or more. Certain embodiments of the present invention may be capable of power dissipation in excess of 1 W for miniature lamp applications (i.e., small area embodiments), and up to and exceeding 1000 W for high power lamp applications (i.e., large area embodiments).

Additionally, the likelihood that any wire bonds utilized may fatigue or break is either eliminated (as in the case with the first embodiment where wire bonds are not required), or significantly reduced, since the present invention does not encapsulate these wire bonds with a solid encapsulant. Because the wire bonds used in the embodiment shown in FIGS. 4 and 5 are surrounded by a liquid or gel, shear forces cannot be transferred to the wire bond as a result of any thermal expansion or contraction as would be the case if they were encapsulated in a conventional encapsulant material.

A manufacturing process for making embodiments of the present invention comprising light engine modules first includes mounting optional surface mount, BGA, chips or other electronic components onto the first substrate. Next, one or more LED chips to the first substrate using eutectic attachment, solder attachment, die-attach adhesive, epoxy or the like. Next, additional optional surface mount, BGA, chips or other electronic components may be mounted onto first substrate. A curing stage or reflow stage is typically performed, as appropriate to form permanent electrical and mechanical bonds between chips and components and the first substrate. Next, wirebonding is performed for embodiments using wirebonds for electrical connection to one or more LED or electronic component chip. Next, a barrier adhesive, seal or gasket material is placed or dispensed onto first or second substrate. The seal material can optionally or additionally be pre-arranged upon or made integral with portions of either first or second substrate. At any point up to this point in the process, optional spacers may be placed within the region subsequently forming the cavity, either by placing or mounting them on the first substrate or the second substrate or by sandwiching them between the two substrates. Next, the first and second substrates are placed in close proximity such that any seal material or structure bridges the narrow gap between them along an appropriate portion of their surfaces. To facilitate large scale manufacturing and production of several modules at one time or modules having several semi-independent chambers, several first substrates may be placed onto one second substrate (and associated seal material) or vice versa. Seal material is next cured, sintered, or melted by thermal treatment or radiation exposure such as baking, IR heating, e-beam or microwave curing, reflow or other similar process. Small openings may be left within first or second substrate or seal material to provide a channel for subsequent filling of the cavity. Fluid may then be introduced into the cavity by vacuum-backfill process, 2-port pressure or gravity filling or other means. After the cavity is filled, openings in the first or second substrate or seal may be plugged with UV curable epoxy or other sealant/barrier material.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An optical radiation emitting device comprising:
  a sealed chamber;
  a fluid intermediary material contained in said sealed chamber and having a refractive index greater than 1.0;
  an inorganic electroluminescent semiconductor radiation emitter that emits optical radiation in response to an electrical signal, said inorganic electroluminescent semiconductor radiation emitter disposed in said sealed chamber in physical and thermal contact with said fluid intermediary material; and
  first and second electrical conductors electrically coupled to said inorganic electroluminescent semiconductor radiation emitter for energizing said inorganic electroluminescent semiconductor radiation emitter.

2. The optical radiation emitting device of claim 1, wherein said fluid intermediary material contained has a refractive index greater than about 1.3.

3. The optical radiation emitting device of claim 1, wherein said fluid intermediary material contained has a refractive index greater than about 1.4.

4. The optical radiation emitting device of claim 1, wherein said fluid intermediary medium is a liquid or gel.

5. The optical radiation emitting device of claim 1, wherein said device exhibits a power density of at least about 2 Watts/in$^2$.

6. The optical radiation emitting device of claim 5, wherein said device exhibits a power density of at least about 5 Watts/in$^2$.

7. The optical radiation emitting device of claim 6, wherein said device exhibits a power density of at least about 10 Watts/in$^2$.

8. The optical radiation emitting device of claim 1, wherein said inorganic electroluminescent semiconductor radiation emitter is an LED chip.

9. The optical radiation emitting device of claim 8, wherein said LED chip comprises one of the materials included in the group consisting of AlInGaP, InGaAlP, GaN, InGaN, AlInGaN, AlGaAs, GaP, GaAsP, SiC and ZnSe.

10. The optical radiation emitting device of claim 8 and further comprising a second LED chip.

11. The optical radiation emitting device of claim 10, wherein said LED chips emit light of complementary colors that combine to form white light.

12. The optical radiation emitting device of claim 1 and further comprising a photoluminescent emitter.

13. The optical radiation emitting device of claim 12, wherein said inorganic electroluminescent semiconductor radiation emitter and said photoluminescent emitter generate radiation with distinctly different peak wavelengths from one another.

14. The optical radiation emitting device of claim 13, wherein the combined radiation generated by said inorganic electroluminescent semiconductor radiation emitter and said photoluminescent emitter form white light.

15. The optical radiation emitting device of claim 12, wherein said photoluminescent emitter comprises a material selected from the group consisting of fluorescent phosphor, fluorescent dye, and fluorescent crystal layer.

16. The optical radiation emitting device of claim 12, wherein said photoluminescent emitter is in contact with said inorganic electroluminescent semiconductor radiation emitter.

17. The optical radiation emitting device of claim 12, wherein said photoluminescent emitter is in contact with a surface of said chamber.

18. The optical radiation emitting device of claim 1, wherein said inorganic electroluminescent semiconductor radiation emitter comprises at least one electrode attached by means selected from the group consisting of: conductive epoxy die attach, eutectic die attach, solder, solder bump, and wire bond.

19. The optical radiation emitting device of claim 1, wherein said inorganic electroluminescent semiconductor radiation emitter emits radiation with a peak wavelength in the visible portion of the optical spectrum.

20. The optical radiation emitting device of claim 1, wherein said inorganic electroluminescent semiconductor radiation emitter emits radiation with a peak wavelength in the UV portion of the optical spectrum.

21. The optical radiation emitting device of claim 1, wherein said inorganic electroluminescent semiconductor radiation emitter emits radiation with a peak wavelength in the IR portion of the optical spectrum.

22. An optical radiation emitting device comprising:
  a metallic substrate;
  a transparent cover attached to said metallic substrate to form a sealed chamber, said transparent cover comprising an integral lens;
  a fluid intermediary material contained in said sealed chamber and having a refractive index greater than 1.0, said fluid intermediary material being substantially electrically nonconductive; and
  an inorganic semiconductor radiation emitter mounted on a surface of said metallic substrate within said sealed chamber in physical and thermal contact with said fluid intermediary material, said inorganic semiconductor radiation emitter emitting optical radiation through said lens in response to an electrical signal.

23. The optical radiation emitting device of claim 22 and further comprising a heat sink in thermal contact with said metallic substrate.

24. The optical radiation emitting device of claim 22, wherein said metallic substrate comprises a reflective cup formed therein in which said inorganic semiconductor radiation emitter is mounted.

25. The optical radiation emitting device of claim 22, wherein said inorganic semiconductor radiation emitter is an LED chip.

26. The optical radiation emitting device of claim 22 and further comprising at least one additional inorganic semiconductor radiation emitter mounted on a surface of said metallic substrate within said sealed chamber in physical and thermal contact with said fluid intermediary material.

27. The optical radiation emitting device of claim 22 and further comprising first and second electrodes electrically coupled to said inorganic semiconductor radiation emitter for supplying an electrical signal thereto.

* * * * *